United States Patent
Yan et al.

(10) Patent No.: US 11,551,992 B2
(45) Date of Patent: Jan. 10, 2023

(54) SEMICONDUCTOR DEVICE

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Jhih-Yang Yan, Taipei (TW); Fang-Liang Lu, New Taipei (TW); Chee-Wee Liu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 225 days.

(21) Appl. No.: 17/067,554

(22) Filed: Oct. 9, 2020

(65) Prior Publication Data

US 2021/0043538 A1 Feb. 11, 2021

Related U.S. Application Data

(62) Division of application No. 16/166,608, filed on Oct. 22, 2018, now Pat. No. 10,804,180.

(Continued)

(51) Int. Cl.
| | |
|---|---|
| *H01L 23/367* | (2006.01) |
| *H01L 29/78* | (2006.01) |
| *H01L 29/66* | (2006.01) |
| *H01L 23/532* | (2006.01) |
| *H01L 29/51* | (2006.01) |
| *H01L 27/092* | (2006.01) |
| *H01L 21/762* | (2006.01) |
| *H01L 23/522* | (2006.01) |

(Continued)

(52) U.S. Cl.
CPC .... *H01L 23/3677* (2013.01); *H01L 21/76224* (2013.01); *H01L 23/5226* (2013.01); *H01L 23/53295* (2013.01); *H01L 27/0924* (2013.01); *H01L 29/4966* (2013.01); *H01L 29/517* (2013.01); *H01L 29/6656* (2013.01); *H01L 29/66545* (2013.01); *H01L 29/785* (2013.01); *H01L 23/373* (2013.01); *H01L 23/3731* (2013.01); *H01L 23/3732* (2013.01); *H01L 23/3736* (2013.01); *H01L 29/165* (2013.01); *H01L 29/7848* (2013.01)

(58) Field of Classification Search
CPC ......... H01L 21/76224; H01L 21/76877; H01L 23/3677; H01L 23/5226; H01L 23/53295; H01L 27/0924; H01L 29/41791; H01L 29/4966; H01L 29/517; H01L 29/66545; H01L 29/6656; H01L 29/66795; H01L 29/785
See application file for complete search history.

(56) References Cited

U.S. PATENT DOCUMENTS

| | | |
|---|---|---|
| 5,285,352 A | 2/1994 | Pastore et al. |
| 7,649,249 B2 | 1/2010 | Noguchi |

(Continued)

*Primary Examiner* — Allan R Wilson
(74) *Attorney, Agent, or Firm* — Maschoff Brennan

(57) ABSTRACT

A device includes plural semiconductor fins, a gate structure, an interlayer dielectric (ILD) layer, and an isolation dielectric. The gate structure is across the semiconductor fins. The ILD surrounds the gate structure. The isolation dielectric is at least between the semiconductor fins and has a thermal conductivity greater than a thermal conductivity of the ILD layer.

20 Claims, 26 Drawing Sheets

Related U.S. Application Data

(60) Provisional application No. 62/593,148, filed on Nov. 30, 2017.

(51) Int. Cl.
 *H01L 29/49* (2006.01)
 *H01L 23/373* (2006.01)
 *H01L 29/165* (2006.01)

(56) References Cited

U.S. PATENT DOCUMENTS

| | | |
|---|---|---|
| 9,105,490 B2 | 8/2015 | Wang et al. |
| 9,136,249 B2 | 9/2015 | Kim et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2006/0197181 A1 | 9/2006 | Noguchi |
| 2007/0227761 A1 | 10/2007 | Tuominen et al. |
| 2011/0001162 A1 | 1/2011 | Nakayama et al. |
| 2012/0261166 A1 | 10/2012 | Oh et al. |
| 2015/0319842 A1 | 11/2015 | Asano et al. |
| 2018/0076097 A1* | 3/2018 | Ching .................. H01L 27/0924 |
| 2019/0067417 A1* | 2/2019 | Ching ............. H01L 21/823481 |

\* cited by examiner

SEMICONDUCTOR DEVICE

PRIORITY CLAIM AND CROSS-REFERENCE

This application is a divisional application of U.S. patent application Ser. No. 16/166,608, filed Oct. 22, 2018, now U.S. Pat. No. 10,804,180, issued Oct. 13, 2020, which claims priority of U.S. Provisional Application Ser. No. 62/593,148, filed on Nov. 30, 2017, the entirety of which is incorporated by reference herein in their entireties.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
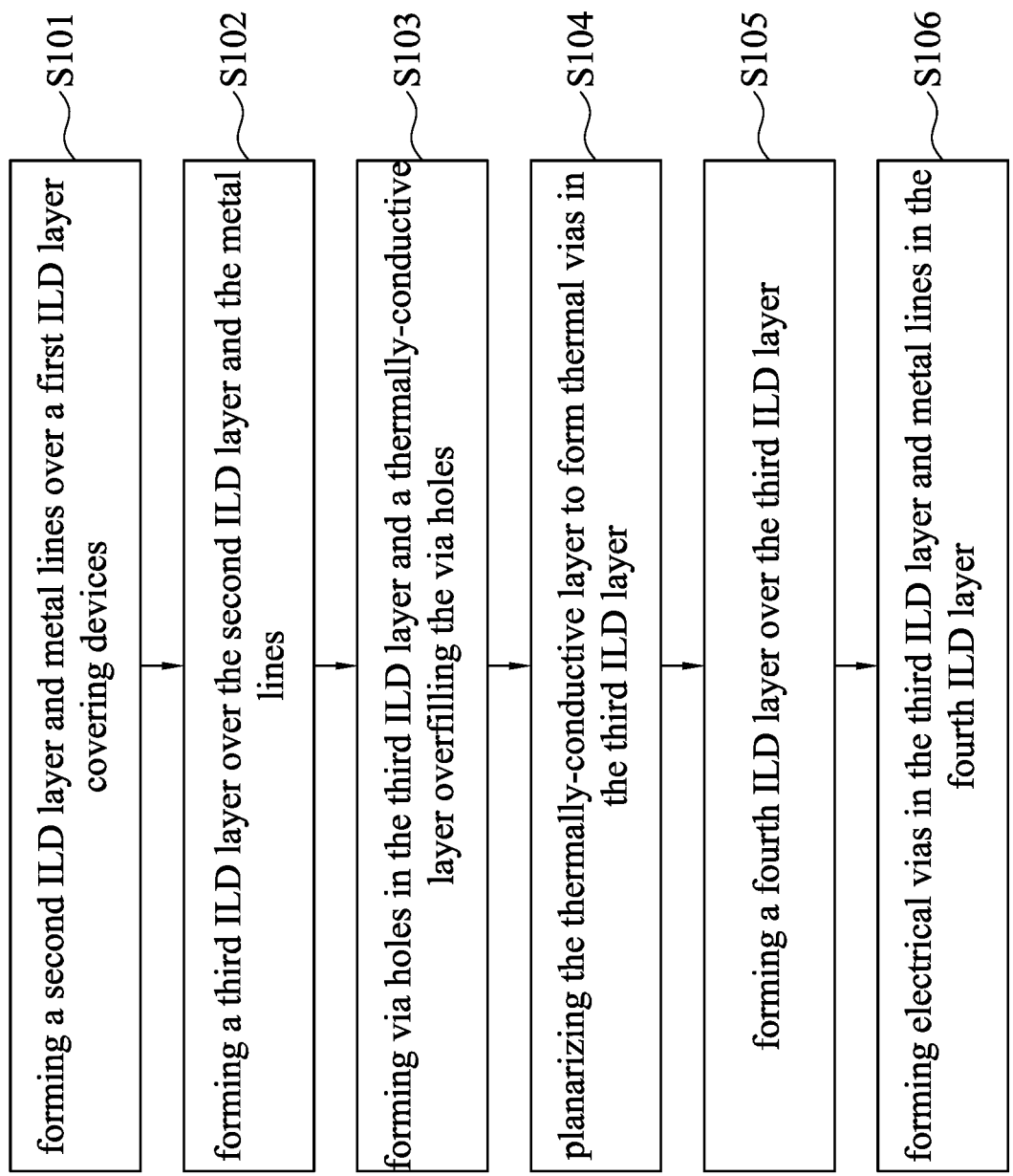
FIG. 1 is a flowchart of a method for manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
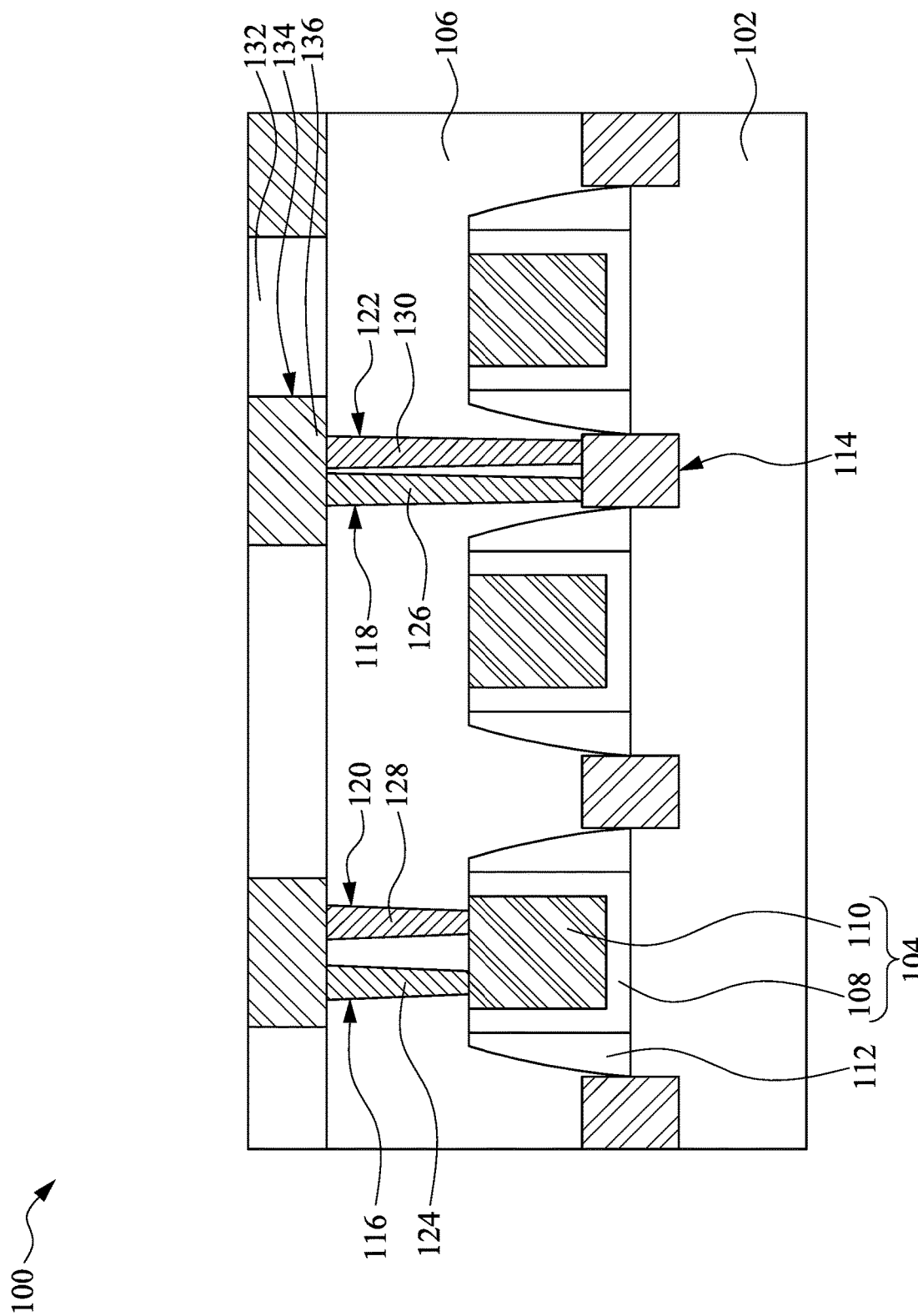
FIGS. 2-7 illustrate a method of forming a semiconductor device in accordance with some embodiments of the present disclosure.
Figure 3:
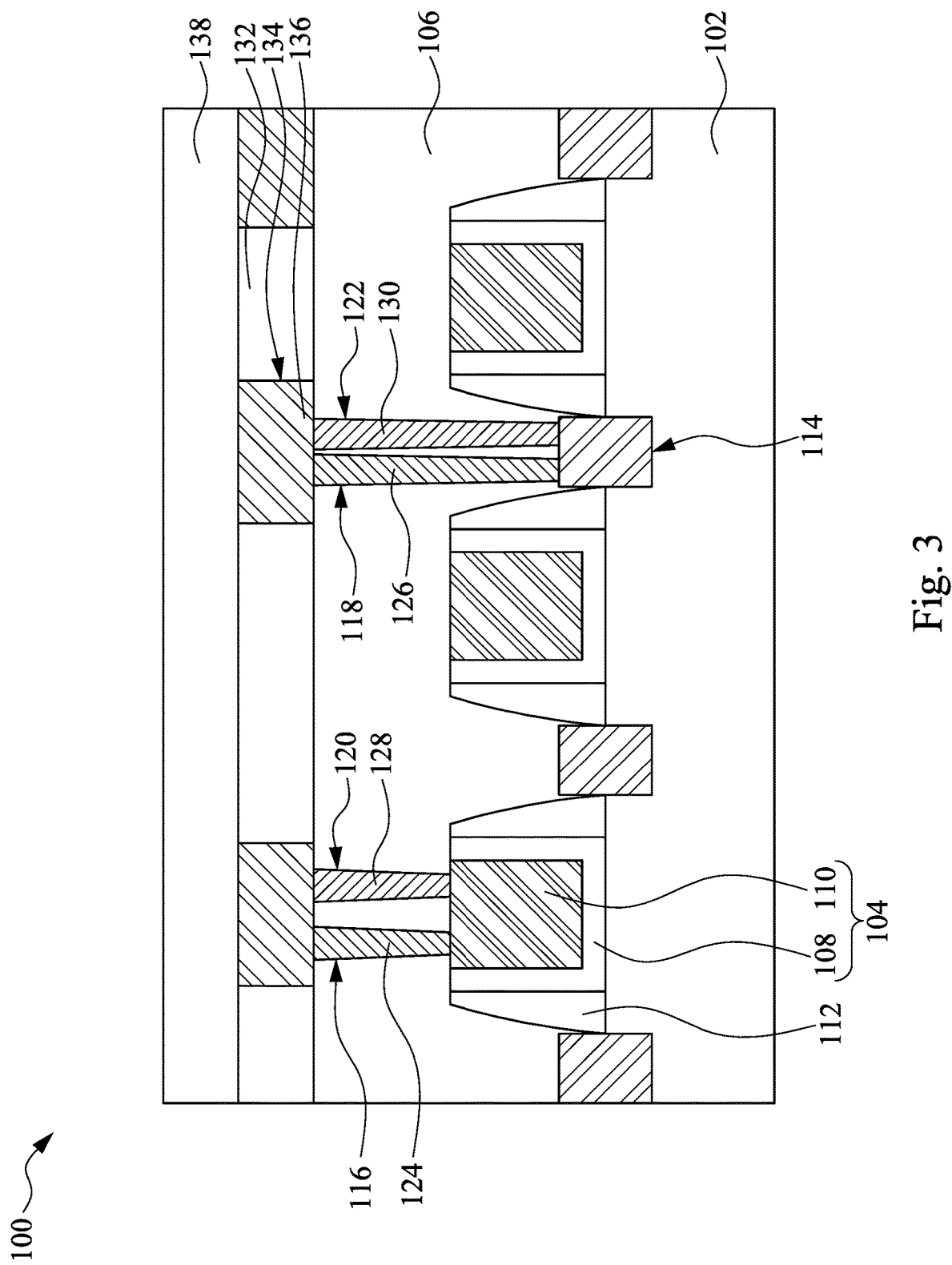
Figure 4:
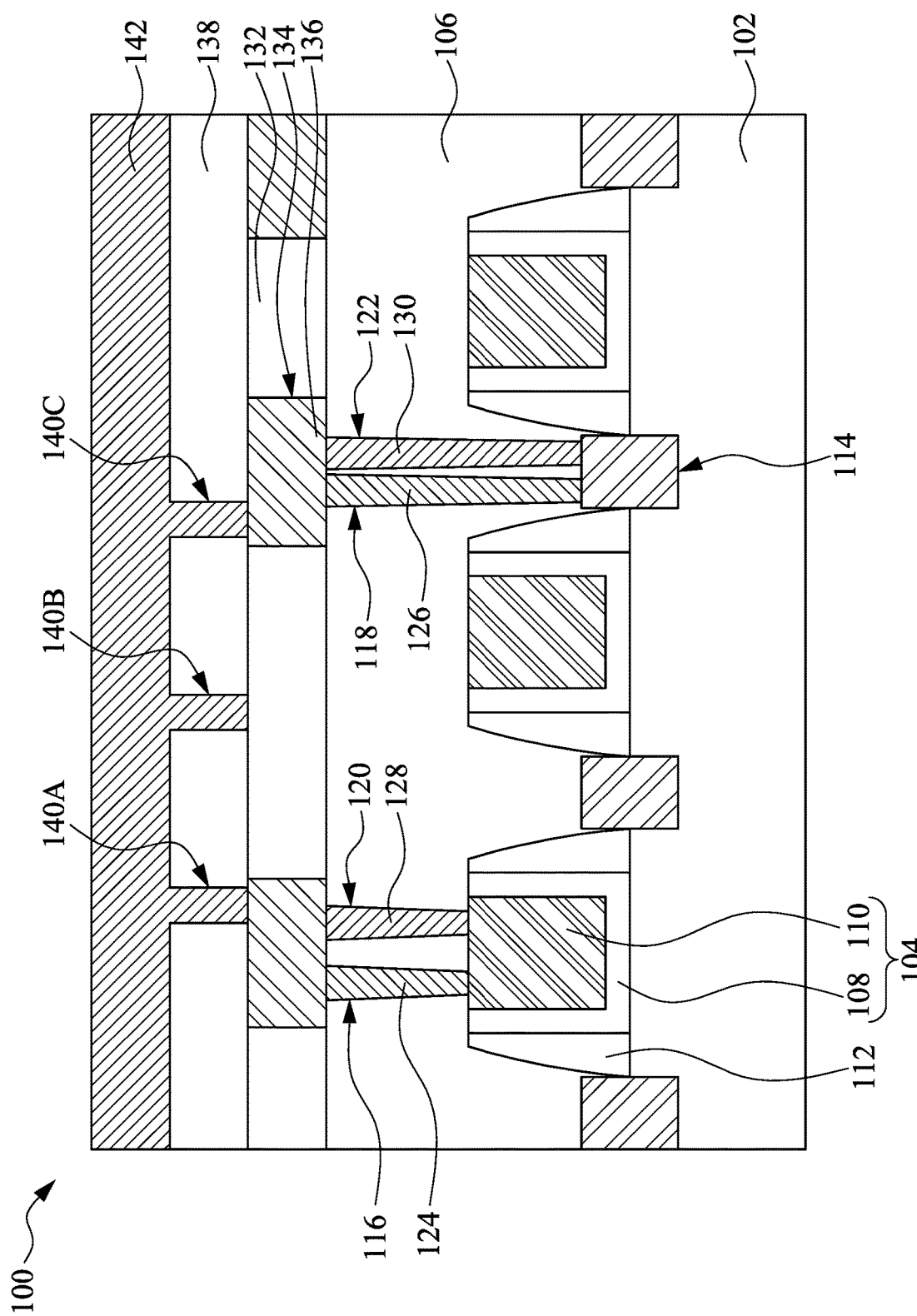
Figure 5:
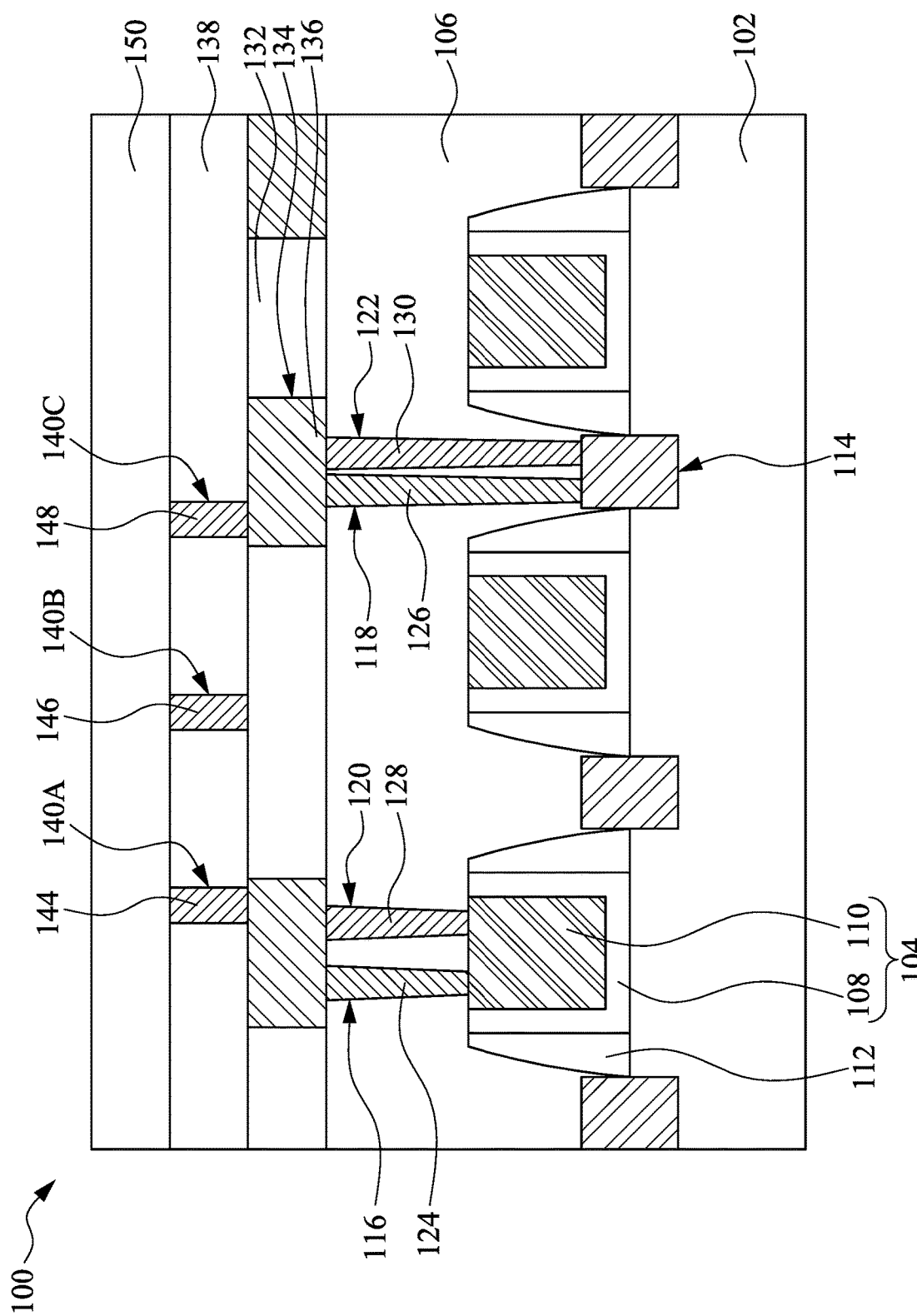
Figure 6:
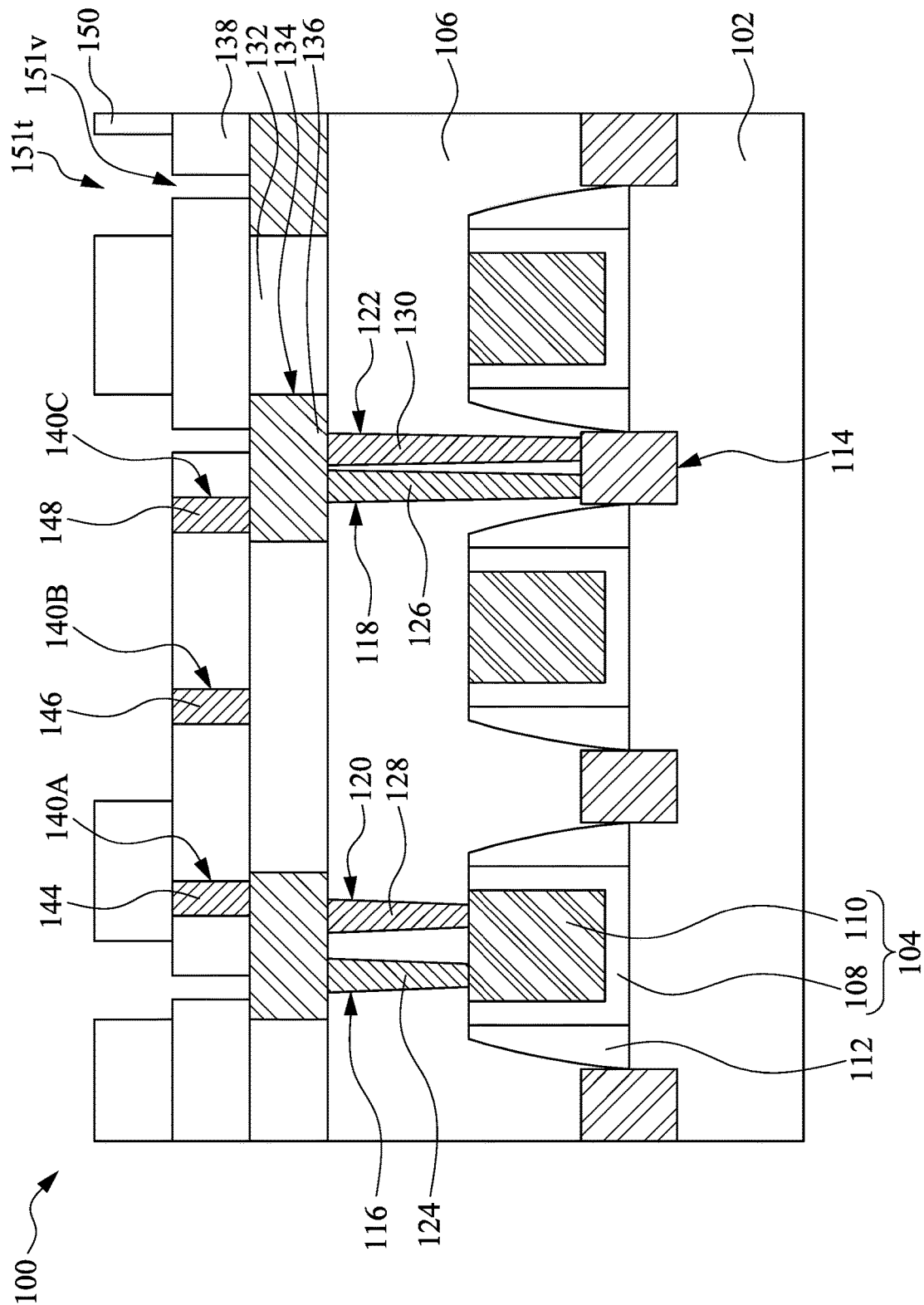
Figure 7:
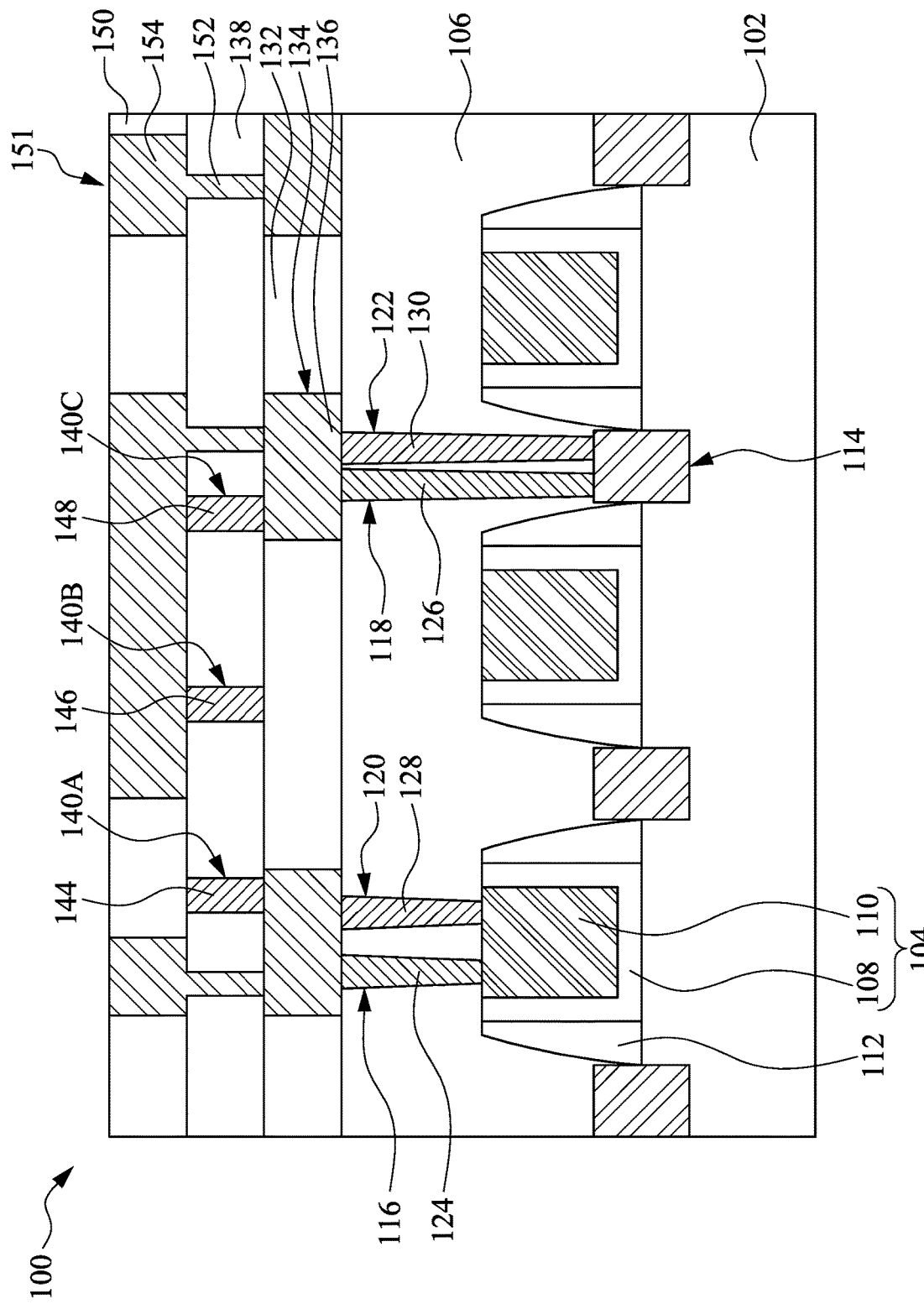

FIG. 1 is a flowchart of a method for manufacturing a semiconductor device in accordance with some embodiments of the present disclosure. FIGS. 2-7 illustrate a method of forming a semiconductor device 100 in accordance with some embodiments of the present disclosure. The method begins with block S101 in which a second ILD layer 132 and metal lines 136 are formed over a first ILD layer 106 covering devices such as transistors, diodes or capacitors (as shown in FIG. 2). The method continues with block S102 in which a third ILD layer 138 is formed over the second ILD layer 132 and the metal lines 136 (as shown in FIG. 3). The method continues with block S103 in which via holes 140A-140C is formed in the third ILD layer 138 and a thermally-conductive layer 142 is form to overfill the via holes 140A-140C (as shown in FIG. 4). The method continues with block S104 in which the thermally-conductive layer 142 is planarized to form thermal vias 144, 146, 148 in the third ILD layer 138 (as shown in FIG. 5). The method continues with block S105 in which a fourth ILD layer 150 is formed over the third ILD layer 138 (as shown in FIG. 5). The method continues with block S106 in which electrical vias 152 and metal lines 154 are respectively formed in the third ILD layer 138 and the fourth ILD layer 150 (as shown in FIGS. 6 and 7).

Reference is made to FIG. 2. Source/drain regions 114 and gate structures 104 are formed on a substrate 102 to serve as transistors. A first interlayer dielectric (ILD) layer 106 is formed over the source/drain regions 114 and the gate structures 104. A second ILD layer 132 is formed over the first ILD layer 106, and metal lines 136 are formed in the second ILD layer 132.

In some embodiments, the substrate 102 includes a silicon substrate. In some alternative embodiments, the substrate 102 is made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the substrate 102 further includes other features such as various doped regions, a buried layer, and/or an epitaxy layer. Furthermore, in some embodiments, the substrate 102 may be a semiconductor on insulator such as silicon on insulator (SOI) or silicon on sapphire. In some embodiments, the substrate 102 includes a doped epi layer, a gradient semiconductor layer, and/or may further include a semiconductor layer overlying another semiconductor layer of a different type such as a silicon layer on a silicon germanium layer. In some embodiments, the substrate 102 includes a multilayer silicon structure or a multilayer compound semiconductor structure.

In some embodiments, the substrate 102 further includes active regions having various doping configurations. In some embodiments, the active regions are doped with p-type or n-type dopants. For example, the active regions are doped with p-type dopants, such as boron or $BF_2$; n-type dopants, such as phosphorus or arsenic; and/or combinations thereof. In some embodiments, the active regions are configured for an N-type metal-oxide-semiconductor field effect transistor (referred to as an NMOSFET), or alternatively configured for a P-type metal-oxide-semiconductor field effect transistor (referred to as a PMOSFET).

The gate structure 104 includes a gate dielectric layer 108 and a gate electrode 110. The gate dielectric layer 108 is formed over the substrate 102 and the gate electrode 110 is formed over the gate dielectric layer 108.

In some embodiments, the gate dielectric layer 108 includes a silicon oxide, silicon oxynitride, or high-k dielectric material. A high-k dielectric material is defined as a dielectric material with a dielectric constant greater than that of $SiO_2$, and the high-k dielectric material includes metal oxide. In some embodiments, the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In some embodiments, the gate dielectric layer 108 is formed by using a suitable deposition process, such as a chemical vapor deposition (CVD) process or an atomic layer deposition (ALD) process. In some embodiments, the gate dielectric layer 108 further includes an interfacial layer (not illustrated) to minimize stress between the gate dielectric layer 108 and the substrate 102. In some embodiments, the interfacial layer is formed of silicon oxide or silicon oxynitride grown by a thermal oxidation process. For example, the interfacial layer can be grown by a rapid thermal oxidation (RTO) process or in an annealing process comprising oxygen.

In some embodiments, the gate electrode layer 110 includes a single layer or multilayer structure. In some embodiments, the gate electrode layer 110 includes poly-silicon. Furthermore, the gate electrode layer 110 may be doped poly-silicon with the uniform or gradient doping. In some embodiments, the gate electrode layer 110 is formed by using a low-pressure CVD (LPCVD) process. In some other embodiments, the gate electrode layer 110 is a metal gate.

In some embodiments, at least one pair of spacers 112 is formed on sidewalls of at least one of the gate structures 104, in which the spacers 112 are formed of silicon oxide, silicon nitride, silicon oxynitride, silicon carbide, fluoride-doped silicate glass (FSG), a low k dielectric material, and/or combinations thereof. In some embodiments, at least one of the spacers 112 may have a multiple-layers structure, for example, including one or more liner layers.

In some embodiments, epitaxial source/drain (S/D) features 114 are formed in the substrate 102. The epitaxial S/D features 114 may be formed using one or more epitaxy or epitaxial (epi) processes, such that Si features, SiGe features, silicon phosphate (SiP) features, silicon carbide (SiC) features and/or other suitable features can be formed in a crystalline state. In some embodiments, lattice constants of the epitaxial S/D features 114 are different from that of the substrate 102, so that a channel region between the epitaxial S/D features 114 can be strained or stressed by the epitaxial S/D features 114 to improve carrier mobility of the semiconductor device 100 and enhance the device performance. The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 102 (e.g., silicon, silicon germanium, silicon phosphate, or the like). The epitaxial S/D features 114 may be in-situ doped. The doping species include p-type dopants, such as boron or $BF_2$; n-type dopants, such as phosphorus or arsenic; and/or other suitable dopants including combinations thereof. If the epitaxial S/D features 114 are not in-situ doped, an implantation process is performed to dope the epitaxial S/D features 114. One or more annealing processes may be performed to activate the epitaxial S/D features 114. The annealing processes include rapid thermal annealing (RTA) and/or laser annealing processes.

In some embodiments, an isolation region (not shown) is formed in the substrate 102 to isolate the various active regions of the substrate 102. The isolation regions may utilize isolation technology, such as local oxidation of silicon (LOCOS) or shallow trench isolation (STI) region, to define and electrically isolate the various active regions of the substrate 102. In some embodiments, at least one of the isolation regions serves as a STI region. The isolation regions include silicon oxide, silicon nitride, silicon oxynitride, fluoride-doped silicate glass (FSG), a low-K dielectric material, other suitable materials, or combinations thereof.

In some embodiments, the first ILD layer 106 is a multilayer dielectric structure. If a gate-last approach is employed, formation of the first ILD layer 106 includes, for example, depositing an ILD-0 layer over dummy gates (e.g., made of polysilicon), performing a chemical mechanical polish (CMP) process to the ILD-0 layer until reaching the dummy gates, replacing the dummy gates with metal gates 104, and depositing an ILD-1 layer over the ILD-0 layer and the metal gates 104. The ILD-0 and ILD-1 layers are in combination referred to as the first ILD layer 106. In some embodiments, the dielectric constant of the first ILD layer 106 may be less than about 3.9. The first ILD layer 106 may include a low dielectric constant (low-k) dielectric material. The dielectric constant of the low-k dielectric material may be about 2.7 to about 3.0. Suitable materials for the low-k dielectric material may include, but are not limited to, doped silicon dioxide, fluorinated silica glass (FSG), carbon-doped silicon dioxide, porous silicon dioxide, porous carbon-doped silicon dioxide, Xerogel, Aerogel, amorphous fluorinated carbon, Parylene, bis-benxocyclocutenes (BCB), polyimide, polynorobonesses, benzocyclocutene, PTFE, hydrogen silsesquioxane (HSQ), methylsilsesquioxane (MSQ), and/or combinations thereof. The low-k dielectric material may be deposited by a chemical vapor deposition (CVD), plasma enhanced CVD (PECVD), or spin-on process. In some embodiments, a tensile SiN contact etch stop layer is deposited before the formation of the first ILD layer.

After the formation of the first ILD layer 106, a layer of photoresist (PR) is applied to the top surface of the first ILD layer 106, and the PR is patterned using, for example, suitable lithography processes. An etching process is performed to the first ILD layer 106 using the patterned PR as an etching mask, resulting in a first gate contact hole 116 over the gate electrode 110 and a first S/D contact hole 118 over the epitaxial S/D feature 114. The etching process may utilize a directional, or anisotropic, etching technique configured to etch vertically through the first ILD layer 106 with minimal lateral etching. In some embodiments, the etching process includes dry etching, wet etching, reactive ion etching RIE, or combinations thereof. Furthermore, the etching process may use any suitable etch chemistry or combination thereof. In some embodiments, the etching process is a selective etching process that etches the ILD layer 106 in a faster rate than the gate electrode 110 and/or epitaxial S/D features 114. For example, fluorine-containing gas, such as $CF_4$, $CH_2F_2$, or $C_4F_6$, is used as the etchant to selectively etch the first ILD layer 106. In order to achieve a proper etch profile and selectivity, the anisotropic plasma etch may include multiple etch portions, such as a main etch, an over etch and a post etch treatment. In the illustrated embodiments, the dry etch creates holes with substantially vertical profiles that stop at the top surfaces of the gate structures 104 and the epitaxial S/D feature 114.

Thereafter, a first gate via 124 and a first S/D via 126 are respectively formed in the first gate contact hole 116 and the first S/D contact hole 118 using a suitable deposition technique prior to the formation of a second gate contact hole 120 and a second S/D contact hole 122. In some embodiments, the first gate via 124 and the first S/D via 126 can be formed by depositing a metal layer in the first gate contact hole 116 and the first S/D contact hole 118, followed by performing a CMP process to remove excess metal outside the holes 116 and 118. In some embodiments, the metal layer may include aluminum (Al), tungsten (W), cobalt (Co), copper (Cu), or combinations thereof, and may be deposited by CVD, PVD, plating, and/or other suitable processes. The first gate via 124 is in electrically coupled to the underlying gate structure 104, and the first S/D via 126 is electrically coupled to the underlying epitaxial S/D feature 114. The first gate via 124 and the first S/D via 126 can be referred to as electrical vias in this context.

After the formation of the first gate via 124 and the first S/D via 126, an etching process can be performed to the first ILD layer 106 by using another PR layer, so as to form a second gate contact hole 120 over the gate electrode 110 and a second S/D contact hole 122 over the S/D feature 114. In some embodiments, the first gate contact hole 116 and the second gate contact hole 120 are above the same gate structure 104, and the first S/D contact hole 118 and the second S/D contact hole 122 are above the same epitaxial S/D feature 114.

Then, a second gate via 128 and a second S/D via 130 are respectively formed in the second gate contact hole 120 and the second S/D contact hole 122, such that the second gate via 128 and the second S/D via 130 are through the first dielectric layer 106. In some embodiments, since the first gate via 124 and the second gate via 128 are through the same ILD layer, the first gate via 124 and the second gate via 128 may have substantially the same height. In some embodiments, since the first S/D via 126 and the second S/D via 130 are through the same ILD layer, the first S/D via 126 and the second S/D via 130 may have substantially the same height. In some embodiments, the second gate via 128 and the second S/D via 130 can be formed by, for example, depositing a thermally-conductive material in the second gate contact hole 120 and the second S/D contact hole 122, followed by performing a CMP process to remove excess thermally-conductive material outside the holes 120 and 122. The second gate via 128 can dissipate heat from the underlying gate electrode 110, and the second S/D via 130 can dissipate heat from the underlying S/D features 114. The second gate via 128 and second S/D via 130 can be referred to as thermal vias that are respectively thermally coupled to the gate electrode 110 and the source/drain region 114 in this context.

In some embodiments, the thermal vias 128 and 130 have a diameter in a range from about 20 nm to about 200 nm. In some embodiments, the thermal vias 128 and 130 are separated by a spacing in a range from about 20 nm to about 1 μm. If the dimension (e.g., the diameter or the spacing) above is out of the selected range, the complexity of the process might increase. In some embodiments, example materials of the thermal vias 128 and 130 may include diamond, aluminum nitride (AlN), diamond-like-carbon (DLC), beryllium oxide (BeO), aluminum oxide ($Al_2O_3$), magnesium oxide (MgO), and boron nitride (BN), or combinations thereof. Such materials of the thermal vias 128 and 130 may have a thermal conductivity greater than silicon or silicon oxide. For example, thermal conductivities of silicon and silicon oxide are respectively about 148 W/m·K and about 1.4 W/m·K, and thermal conductivities of diamond, AlN, and BeO are respectively about 2000 W/m·K, about 285 W/m·K, and about 330 W/m·K. As a result, in some embodiments where the first ILD layer 106 is made of silicon oxide, the thermal vias 128 and 130 have higher thermal conductivities than that of the first ILD layer 106, so as to dissipate heat from the underlying gate electrode 110 and source/drain regions 104.

Furthermore, the material of the thermal vias 128 and 130 may have coefficient of thermal expansion (CTE) less than that of metal, such as copper (Cu). For example, CTE of Cu is about 18 (ppm/K), and CTEs of diamond, AlN, and BeO are respectively about 1.0 ppm/K, about 5.3 ppm/K, and from about 7.4 ppm/K to about 8.9 ppm/K. As a result, concern about CTE mismatch between ILD and vias can be eased, so that the via density can be increased. In some embodiments, the thermal vias 128 and 130 having reduced CTEs as compared to copper may have a thermal conductivity less than that of copper. For example, when the thermal vias 128 and 130 are made of AlN (having thermal conductivity of about 285 W/m·k) or BeO (having thermal conductivity of about 330 W/m·K), the thermal conductivities of the thermal vias 128 and 130 are less than the thermal conductivity of copper (about 401 W/m·K). In some embodiments, when the thermal vias 128 and 130 are made of diamond (having thermal conductivity of about 2000 W/m·K), the thermal conductivities of the thermal vias 128 and 130 are greater than the thermal conductivity of copper (about 401 W/m·K).

In some embodiments where the first gate via 124 and the first S/D via 126 are made of metal (e.g., Cu, Al, or W), the thermal vias 128 and 130 have CTEs less than that of the first gate via 124 and the first S/D via 126, which in turn will be advantageous for improving via density in the first ILD layer 106.

In some embodiments, either the first gate via 124 or the first S/D via 126 has an electrical conductance higher than an electrical conductance of the thermal via 128 or 130 (i.e. the thermal vias 128 and 130 have electrical resistances higher than electrical resistances of the first gate via 124 and the first S/D via 126). For example, the first gate via 124 has an electrical conductance higher than an electrical conductance of the thermal via 128, and the first S/D via 126 has an electrical conductance higher than an electrical conductance of the thermal via 130 (i.e., the thermal via 128 has an electrical resistance higher than an electrical resistance of the first gate via 124, and the thermal via 130 has an electrical resistance higher than an electrical resistance of the first S/D via 126). In some embodiments, the thermal vias 128 and 130 are dielectric. In some embodiments where the first ILD layer 106 is made of silicon oxide, the thermal vias 128 and 130 have thermal conductivities greater than that of the first ILD layer 106, which in turn will be advantageous for dissipating heat from transistors.

After the formation of the thermal vias 128 and 130, a second ILD layer 132 and metal lines 136 are formed above the first ILD layer 106, the electrical vias 124, 126 and the thermal vias 128 and 130. In some embodiments, the second ILD layer 132 may include a low-k dielectric material which may have the dielectric constant in a range from about 2.7 to about 3.0. The second ILD layer 132 may be deposited by a chemical vapor deposition (CVD), plasma enhanced CVD (PECVD), or spin-on process. The metal lines 136 may include aluminum (Al), tungsten (W), cobalt (Co), copper (Cu), or combinations thereof.

In some embodiments, formation of the second ILD layer 132 and the metal lines 136 includes, for example, blanket forming a metal layer over the first ILD layer 106, patterning the metal layer to form the metal lines 136 using suitable lithography and etching techniques, depositing the second ILD layer 132 over and among the metal lines 136, and performing a CMP process to the second ILD layer 132 until the metal lines 136 are exposed. In alternative embodiments, formation of the second ILD layer 132 and the metal lines 136 includes, for example, blanket forming the second ILD layer 132 over the first ILD layer 106, forming trenches 134 in the second ILD layer 132 using suitable lithography and etching techniques, filling the trenches 134 with a metal layer, and performing a CMP process to remove a portion of the metal layer outside the trenches 134, while remaining portions of the metal layer in the trenches 134 to serve as the metal lines 136.

Reference is made to FIG. 3. A third ILD layer 138 is formed over the second ILD layer 132 and the metal lines 136. In some embodiments, the third ILD layer 138 may include a low-k dielectric material which may have the dielectric constant in a range from about 2.7 to about 3.0. The third ILD layer 138 may be deposited by a chemical vapor deposition (CVD), plasma enhanced CVD (PECVD), or spin-on process. After the formation of the third ILD layer 138, the second ILD layer 132 and the metal lines 136 are covered by the third ILD layer 138.

Reference is made to FIG. 4. Via holes 140A, 140B, and 140C are formed in the third ILD layer 138 by any suitable process. For example, the formation of the via holes 140A, 140B, and 140C may include patterning the third ILD layer 138 by photolithography and etching processes. The etching process may be performed by using a dry etching, wet etching, and/or plasma etching process, so as to remove some portions of the third ILD layer 138. In some embodiments, at least one of the via holes 140A, 140B, and 140C is over the corresponding metal line 136. For example, the via holes 140A and 140C are over the metal lines 136. Then, a thermally-conductive layer 142 is deposited until overfilling the via holes 140A, 140B, and 140C. In some embodiments, example materials of the thermally-conductive layer 142 may include diamond, aluminum nitride (AlN), diamond-like-carbon (DLC), beryllium oxide (BeO), aluminum oxide ($Al_2O_3$), magnesium oxide (MgO), and boron nitride (BN), or combinations thereof. Such materials of the thermally-conductive layer 142 may have a thermal conductivity greater than silicon or silicon oxide. For example, thermal conductivities of silicon and silicon dioxide are respectively about 148 W/m·K and about 1.4 W/m·K, and thermal conductivities of diamond, AlN, and BeO are respectively about 2000 W/m·K, about 285 W/m·K, and about 330 W/m·K.

Furthermore, the material of the thermally-conductive layer 142 may have coefficient of thermal expansion (CTE) less than that of copper (Cu). For example, CTE of Cu is about 18 ppm/K, and CTEs of diamond, AlN, and BeO are respectively about 1.0 ppm/K, about 5.3 ppm/K, and from about 7.4 ppm/K to about 8.9 ppm/K. As a result, concern about CTE mismatch between ILD and vias can be eased, so that the via density can be increased. In some embodiments, the thermally-conductive layer 142 having the reduced CTE as compared to copper may have a thermal conductivity less than that of Cu. For example, when the thermally-conductive layer 142 is made of AlN (having thermal conductivity of about 285 W/m·K) or BeO (having thermal conductivity of about 330 W/m·K), the thermal conductivity of the thermally-conductive layer 142 is less than the thermal conductivity of copper (about 401 W/m·K).

Reference is made to FIG. 5. After the formation of the thermally-conductive dielectric layer 142 (see FIG. 4), a planarization process such as CMP can be performed to remove the excess thermally-conductive dielectric layer 142, and the remained portions of the thermally-conductive layer 142 may serve as a first thermal via 144 within the via hole 140A, a second thermal via 146 within the via hole 140B, and a third thermal via 148 within the via hole 140C. By the planarization process, top surfaces of the first, second, and the third thermal vias 144, 146, 148 are substantially level with a top surface of the third ILD layer 138. In some embodiments, each of the first, second, and third thermal vias 144, 146, 148 has a diameter in a range from about 20 nm to about 200 nm. In some embodiments, the first, second, and third thermal vias 144, 146, 148 are separated by a spacing in a range from about 20 nm to about 1 μm. If the diameter and the spacing are out of the selected ranges as described above, the complexity of formation the thermal vias 144, 146 and 148 might increase. Next, a fourth ILD layer 150 is formed over the third ILD layer 138, the first, second, and the third thermal vias 144, 146, 148. In some embodiments, the fourth ILD layer 150 may include a low-k dielectric material which may have the dielectric constant in a range from about 2.7 to about 3.0. The fourth ILD layer 150 may be deposited by a chemical vapor deposition (CVD), plasma enhanced CVD (PECVD), or spin-on process. After the formation of the fourth ILD layer 150, the first, second, and the third thermal vias 144, 146, 148 are covered by the fourth ILD layer 150.

Reference is made to FIGS. 6 and 7. A dual damascene process is performed to form via holes 151ν in the third ILD layer 138 and trenches 151t in the fourth ILD layer 150 and over the corresponding via holes 151ν. The dual damascene process is performed after the formation of the third thermal vias 144, 146, 148. In greater detail, forming the via holes 151ν and the trenches 151t is performed after forming of the third thermal vias 144, 146, 148. The metal lines 136 are exposed at bottom of respective via holes 151ν. Then, a metal layer is formed in the trenches 151t and via holes 151ν to land on the metal lines 136. In some embodiments, the metal layer may be formed by CVD, PVD, plating, and/or other suitable processes. Afterwards, a planarization process such as CMP can be performed to remove the excess metal layer, while leaving a plurality of electrical vias 152 in the third ILD layer 138 and a plurality of metal lines 154 in the fourth ILD layer 150. In some embodiments, the electrical vias 152 are surrounded by the third ILD layer 138. In some embodiments, the metal lines 154 are surrounded by the fourth ILD layer 150. In some embodiments, example materials of the electrical vias 152 and the metal lines 154 may include aluminum (Al), tungsten (W), cobalt (Co), copper (Cu), or combinations thereof. In some embodiments, the structure above the first ILD layer 106 can be referred to as a back-end-of line (BEOL) structure. For example, the BEOL structure includes the second ILD layer 132, the metal lines 136 in the second ILD layer 132, the third ILD layer 138 over the second ILD layer 132, the thermal vias 144, 146, 148 and electrical vias 152 in the third ILD layer 138, the fourth ILD layer 150, and the metal lines 154 in the fourth ILD layer 150. In some embodiments, at least one of the electrical vias 152 has an electrical conductance higher than an electrical conductance of at least one of the thermal vias 144, 146, 148 (i.e., at least one of the thermal vias 144, 146, 148 has an electrical resistance higher than an electrical resistance of at least one of the electrical vias 152). For example, the thermal vias 144, 146 and 146 are dielectric.

Figure 8:
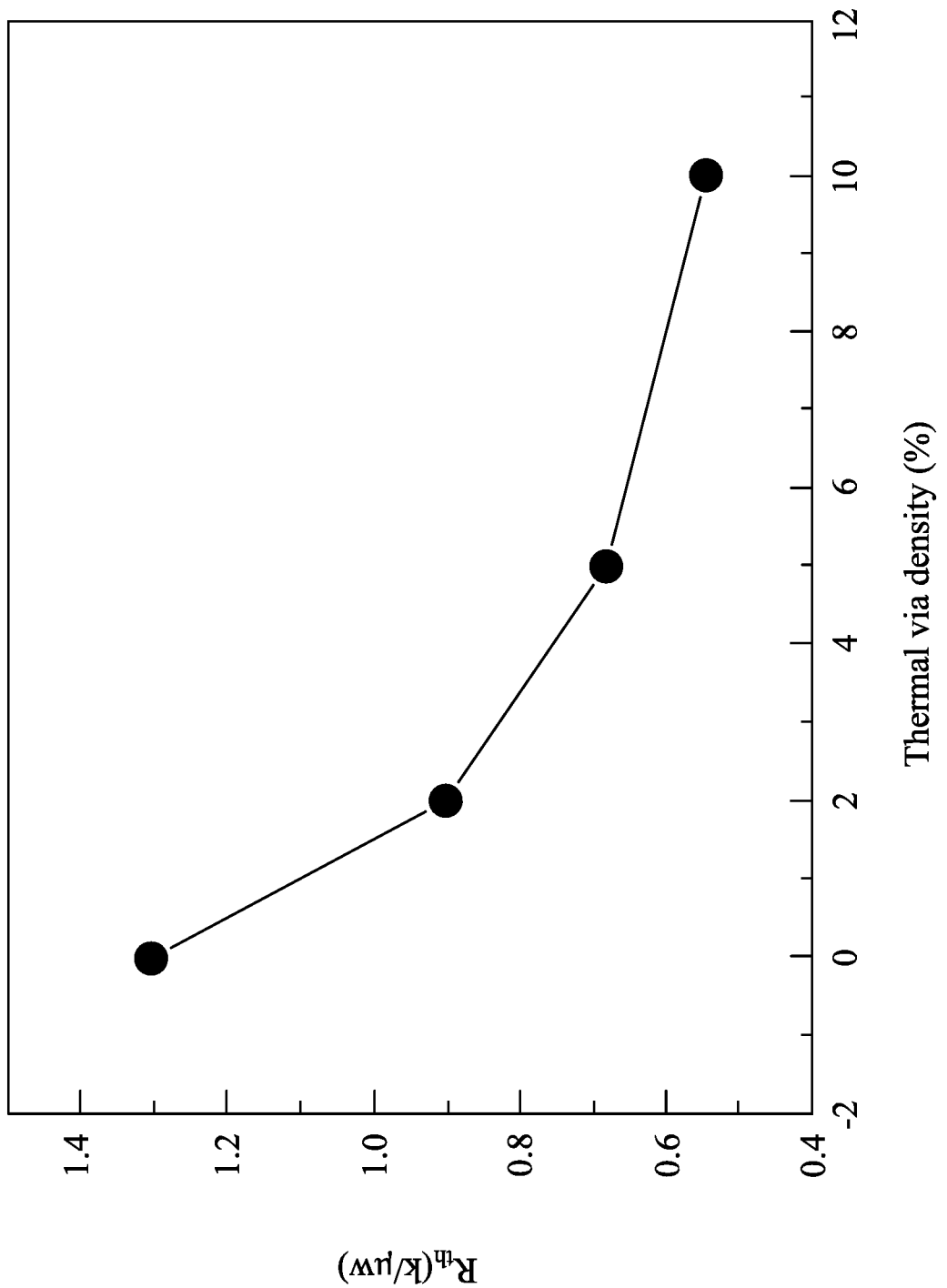
FIG. 8 is a graph plotting thermal resistance versus thermal via density according to some embodiments of the present disclosure.
Figure 9:
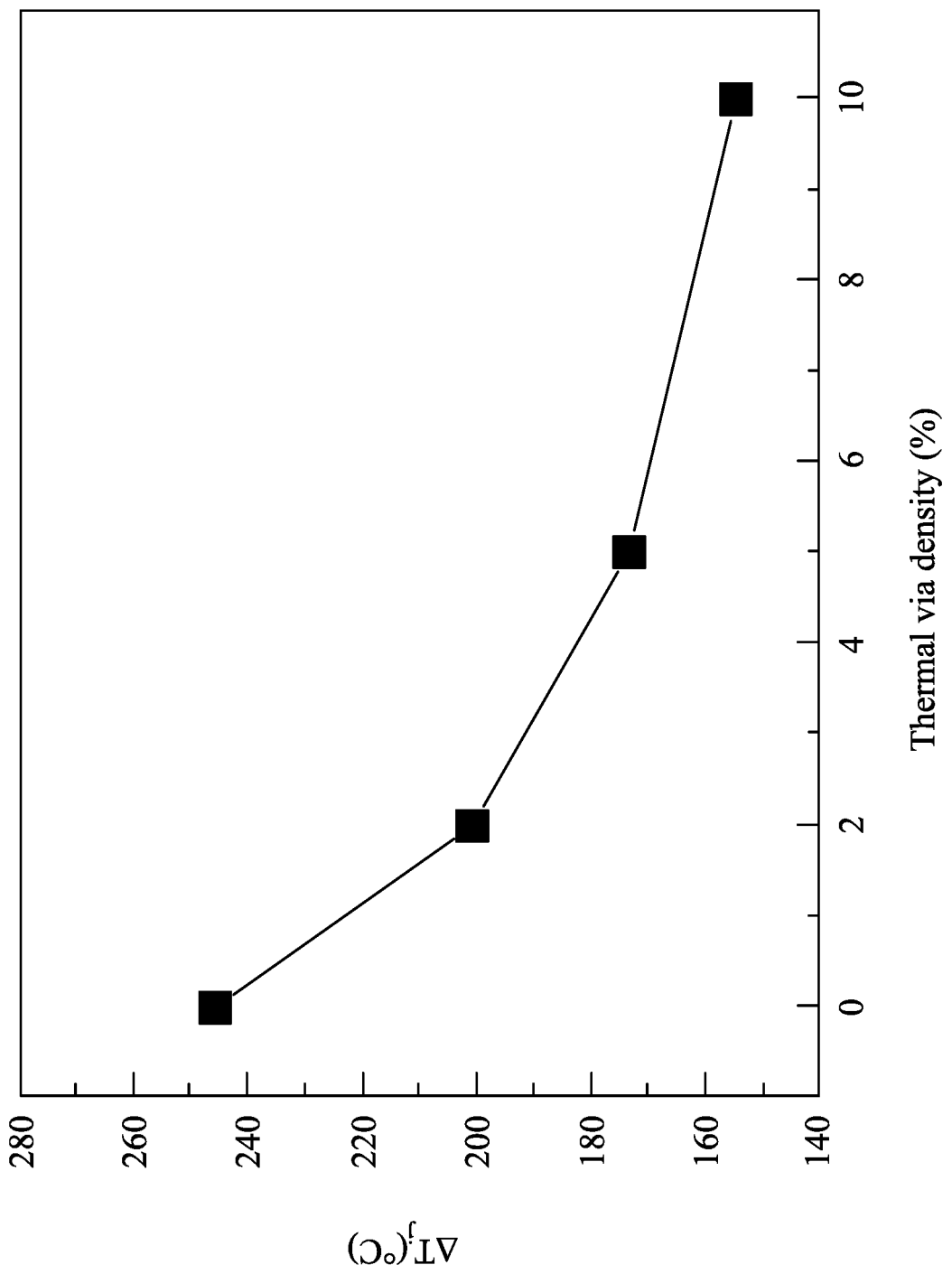
FIG. 9 is a graph plotting junction temperature versus thermal via density according to some embodiments of the present disclosure.

FIG. 8 is a graph plotting thermal resistance versus thermal via density according to some embodiments of the present disclosure, in which the horizontal axis represents a thermal via density (in percentage) in the BEOL structure having BeO thermal vias, and the vertical axis represent a thermal resistance (in k/µw). FIG. 8 shows that the thermal via density is in negative correlation with the thermal resistance. That is, the thermal resistance decreases as the thermal via density increases. FIG. 9 is a graph plotting junction temperature versus thermal via density according to some embodiments of the present disclosure, in which the horizontal axis represents a thermal via density (in percentage) in a semiconductor device (e.g., FinFETs with four fins), and the vertical axis represent a junction temperature (in ° C.). FIG. 9 shows that the thermal via density is in negative correlation with the junction temperature. That is, the junction temperature decreases as the thermal via density increases. As illustrated in FIGS. 8 and 9, increased thermal via density will result in lowered thermal resistance and/or lowered junction temperature. Moreover, because the thermal vias made of electrically-non-conductive materials (e.g., diamond, MN, and/or BeO) have lower CTE as compared to electrical vias made of metal, the concern about CTE mismatch between ILD and vias can be eased, which in turn results in increased via density. As a result, forming thermal vias using the materials, such as diamond, MN, and/or BeO, is advantageous for lowering the thermal resistance and/or junction temperature.

Figure 10:
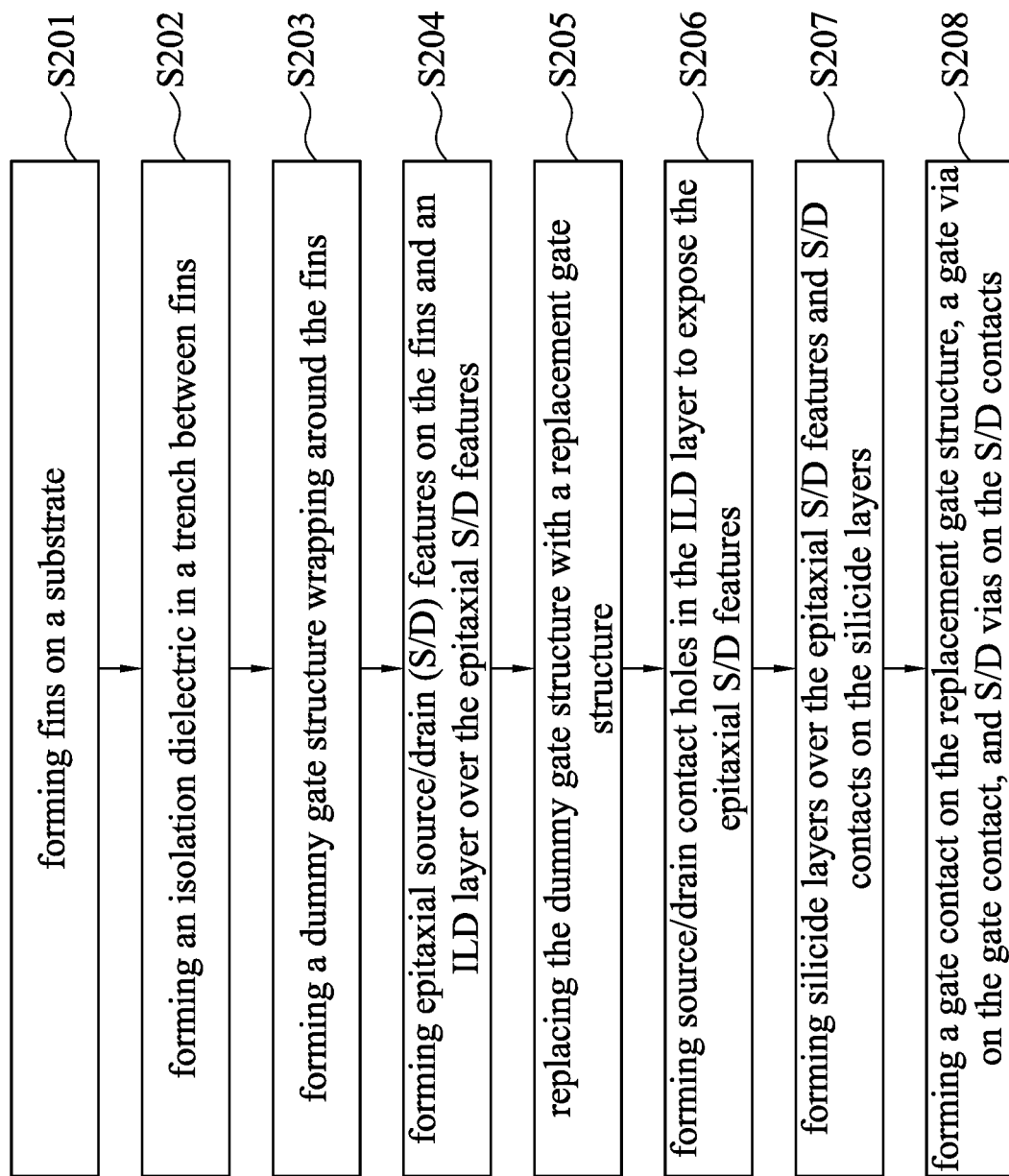
FIG. 10 is a flowchart of a method for manufacturing a semiconductor device in accordance with some embodiments of the present disclosure.
Figure 11:
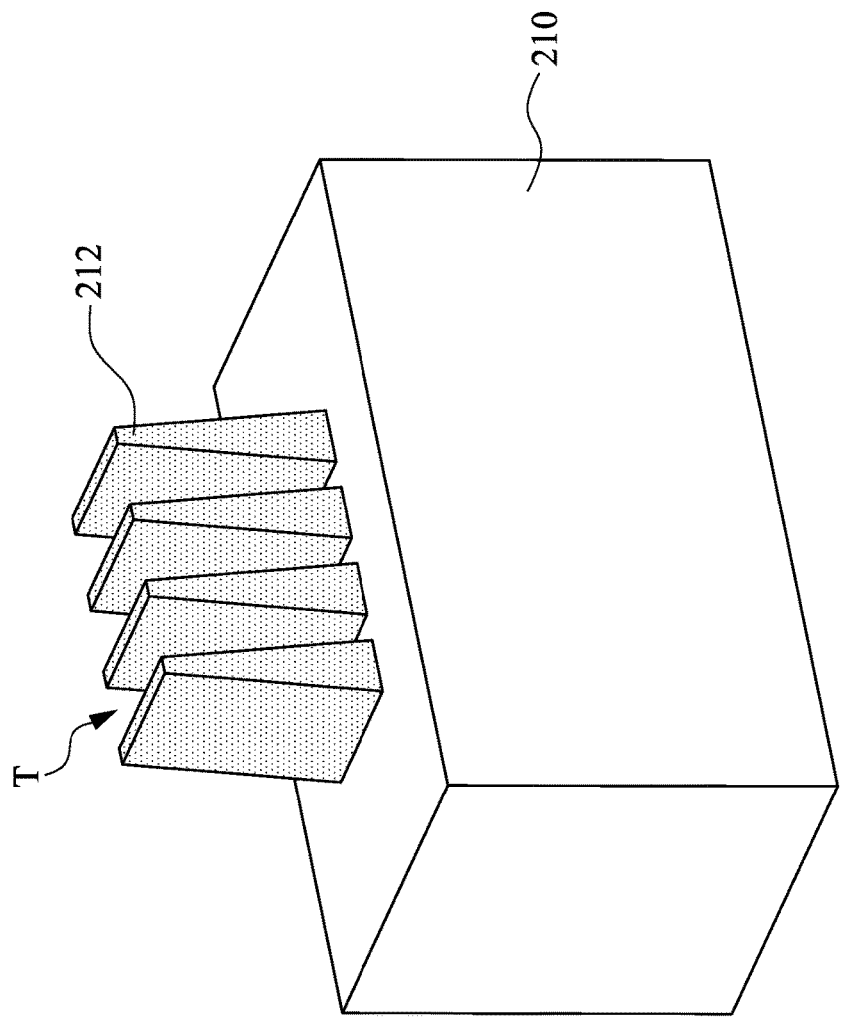
FIGS. 11-19 illustrate a method of forming a semiconductor device in accordance with some embodiments of the present disclosure.
Figure 12:
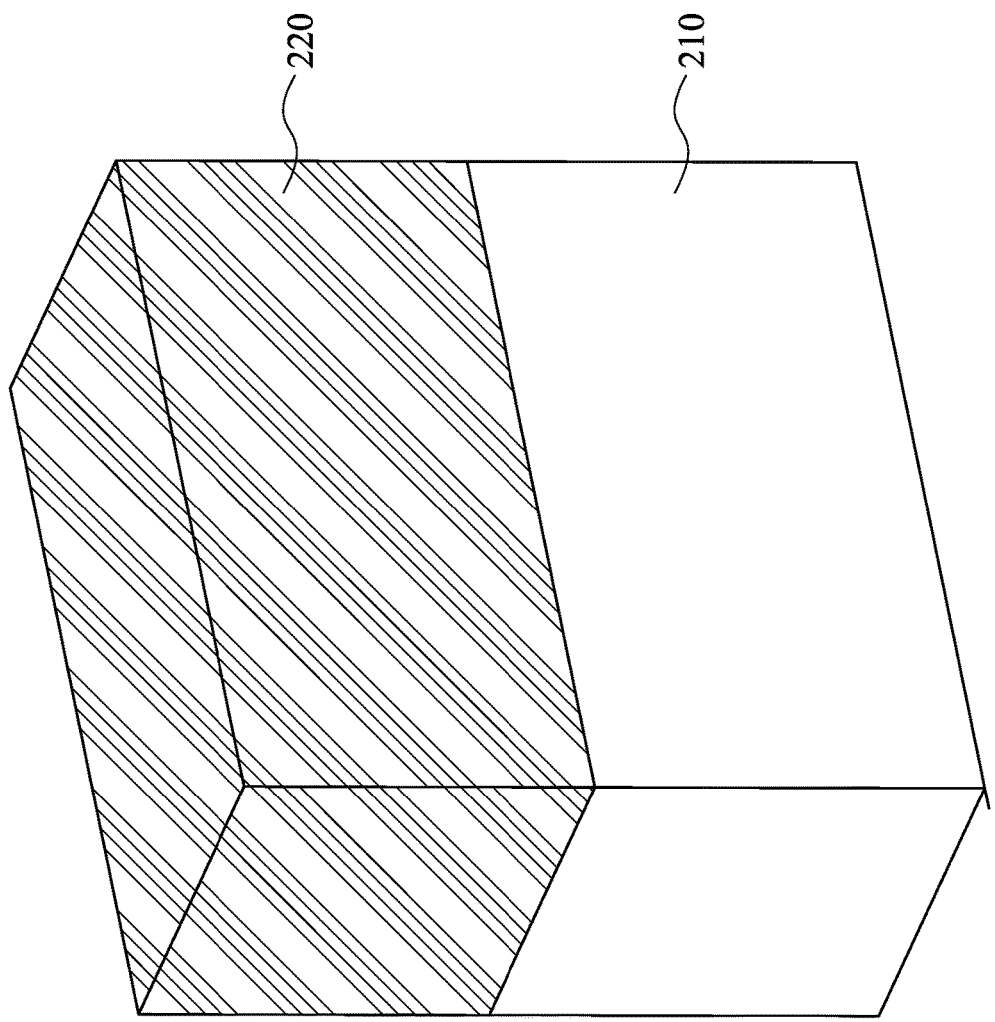
Figure 13:
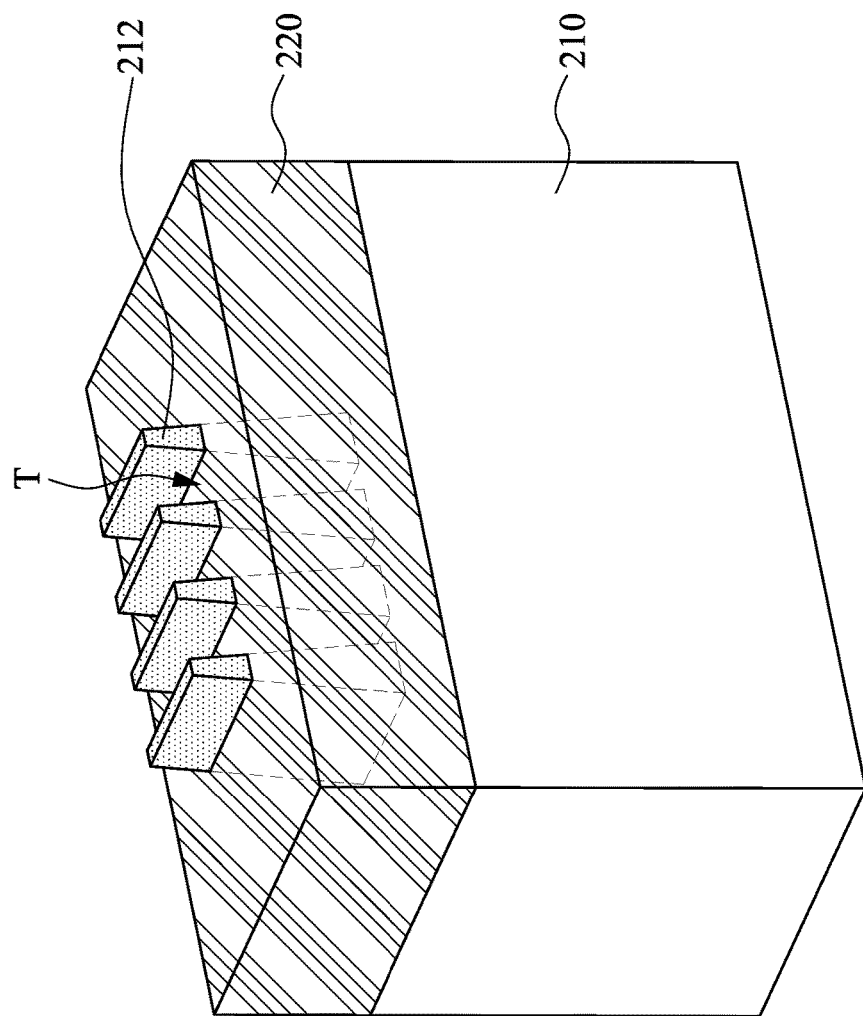
Figure 14:
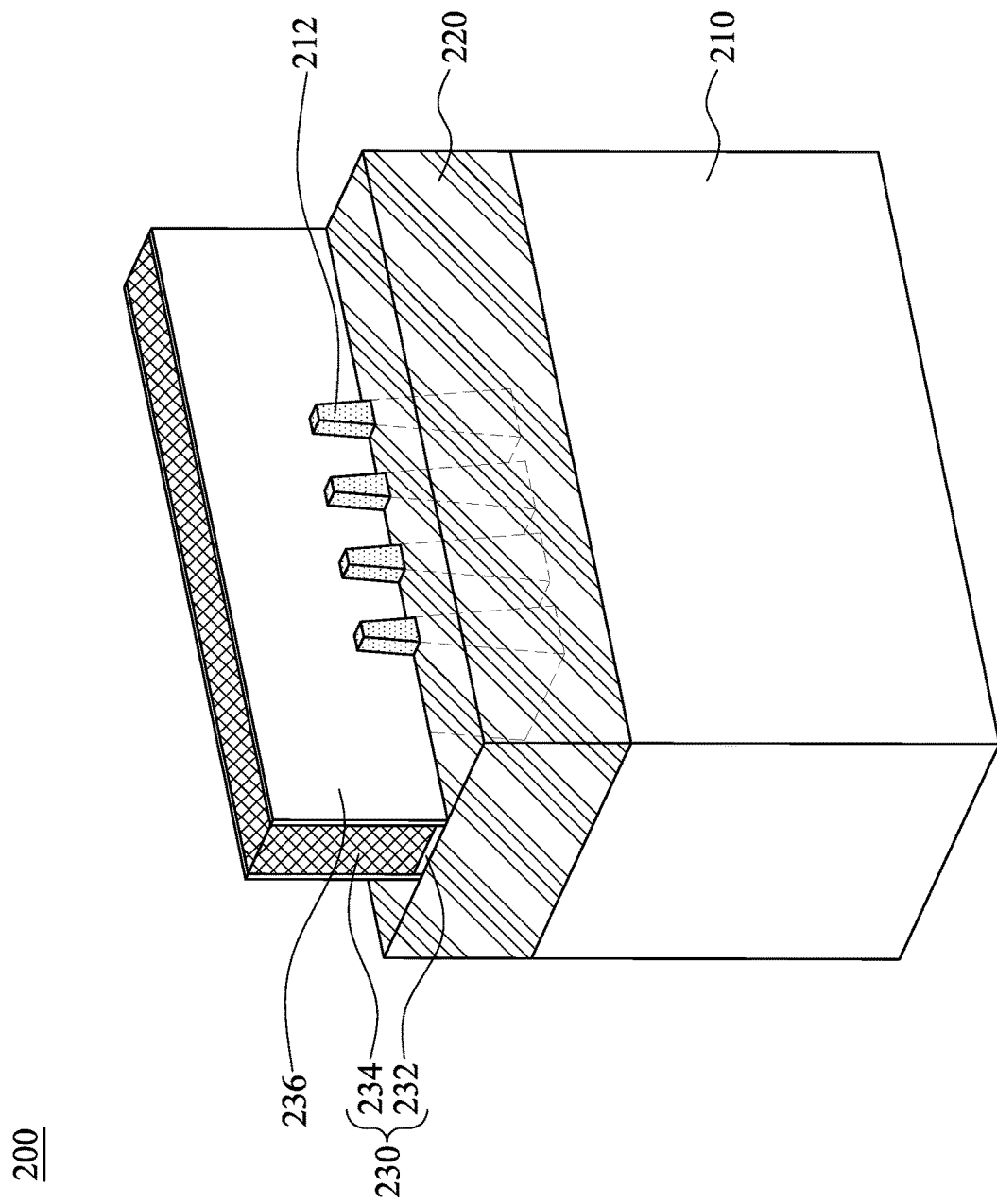
Figure 15:
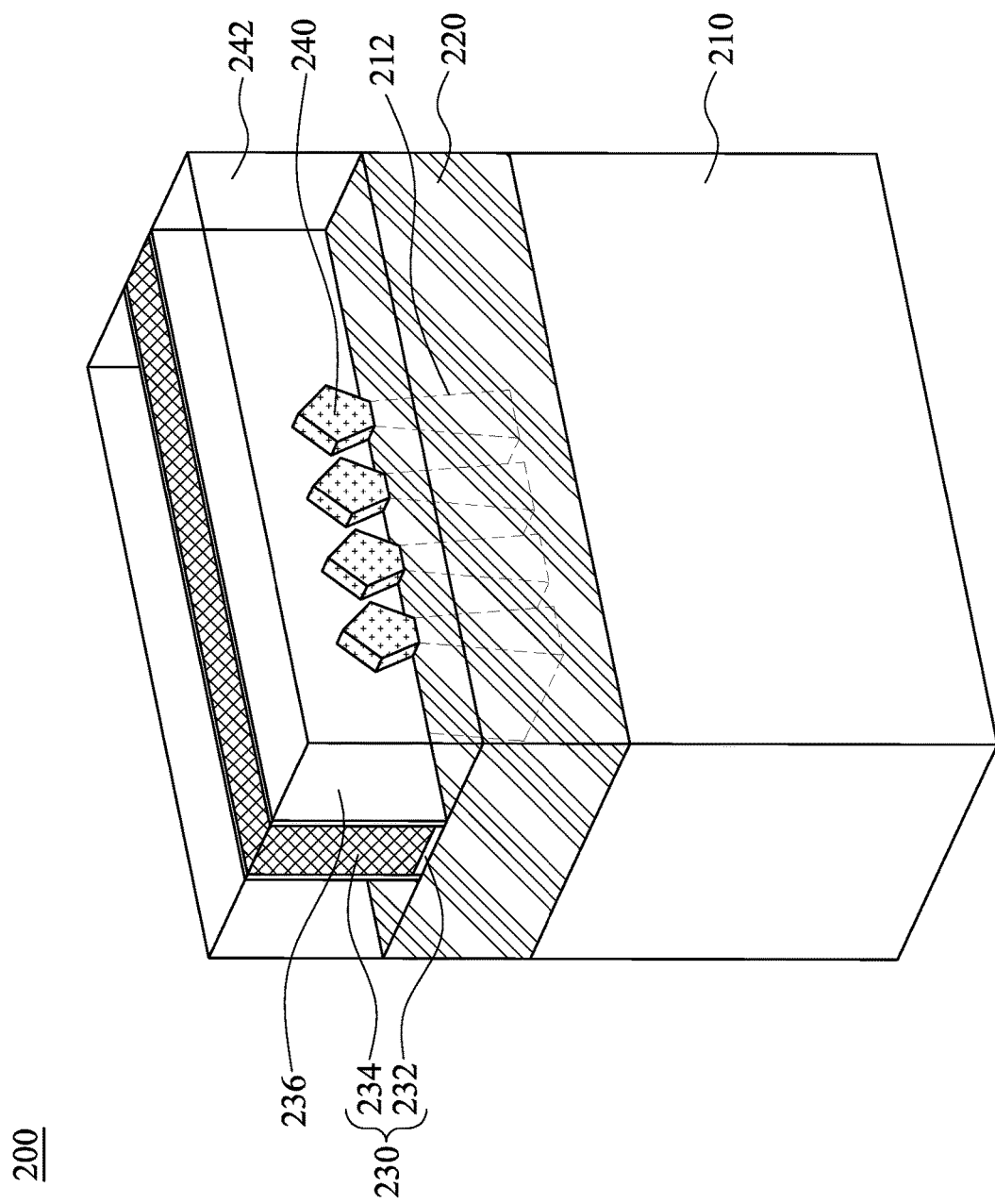
Figure 16:
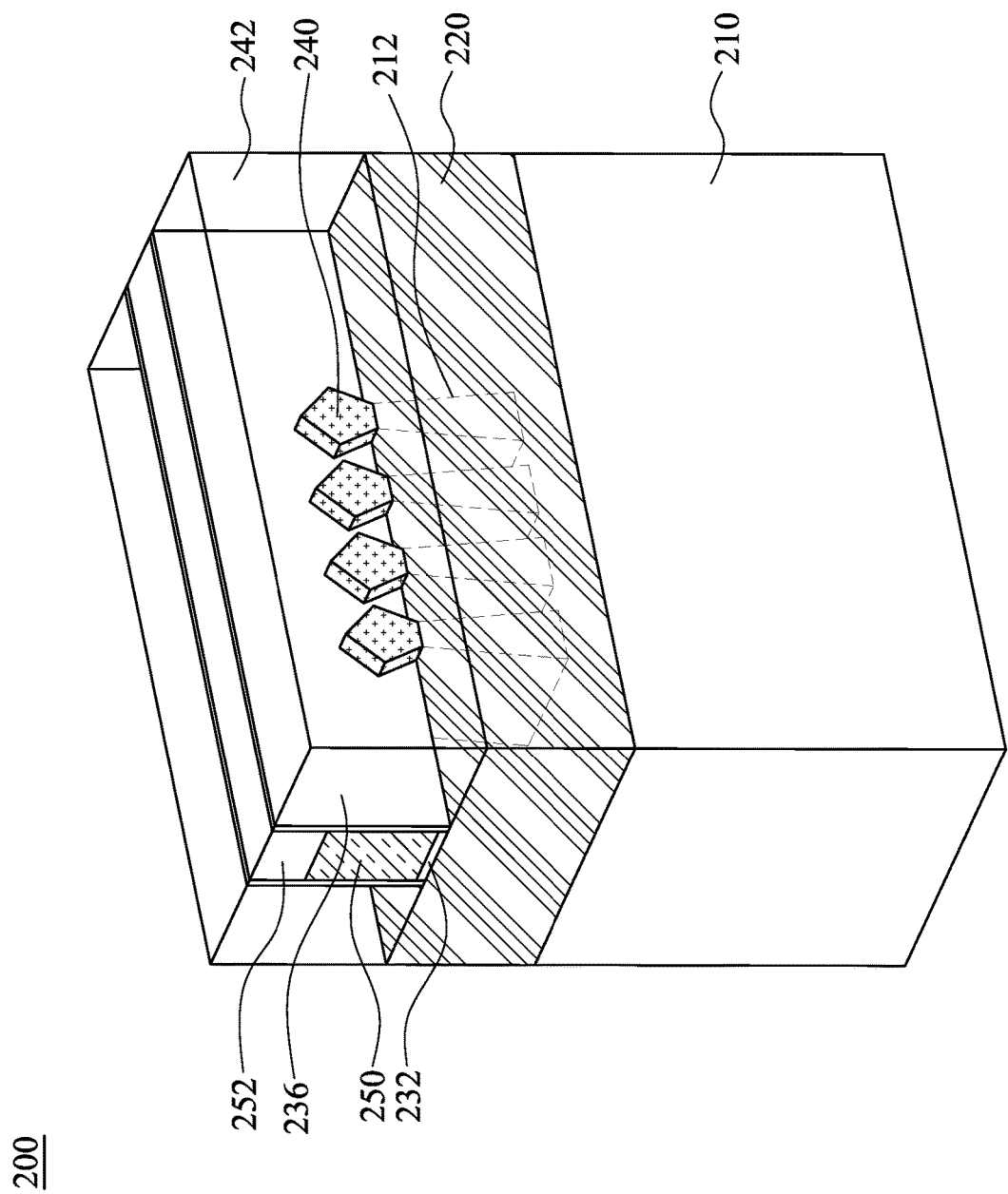
Figure 17:
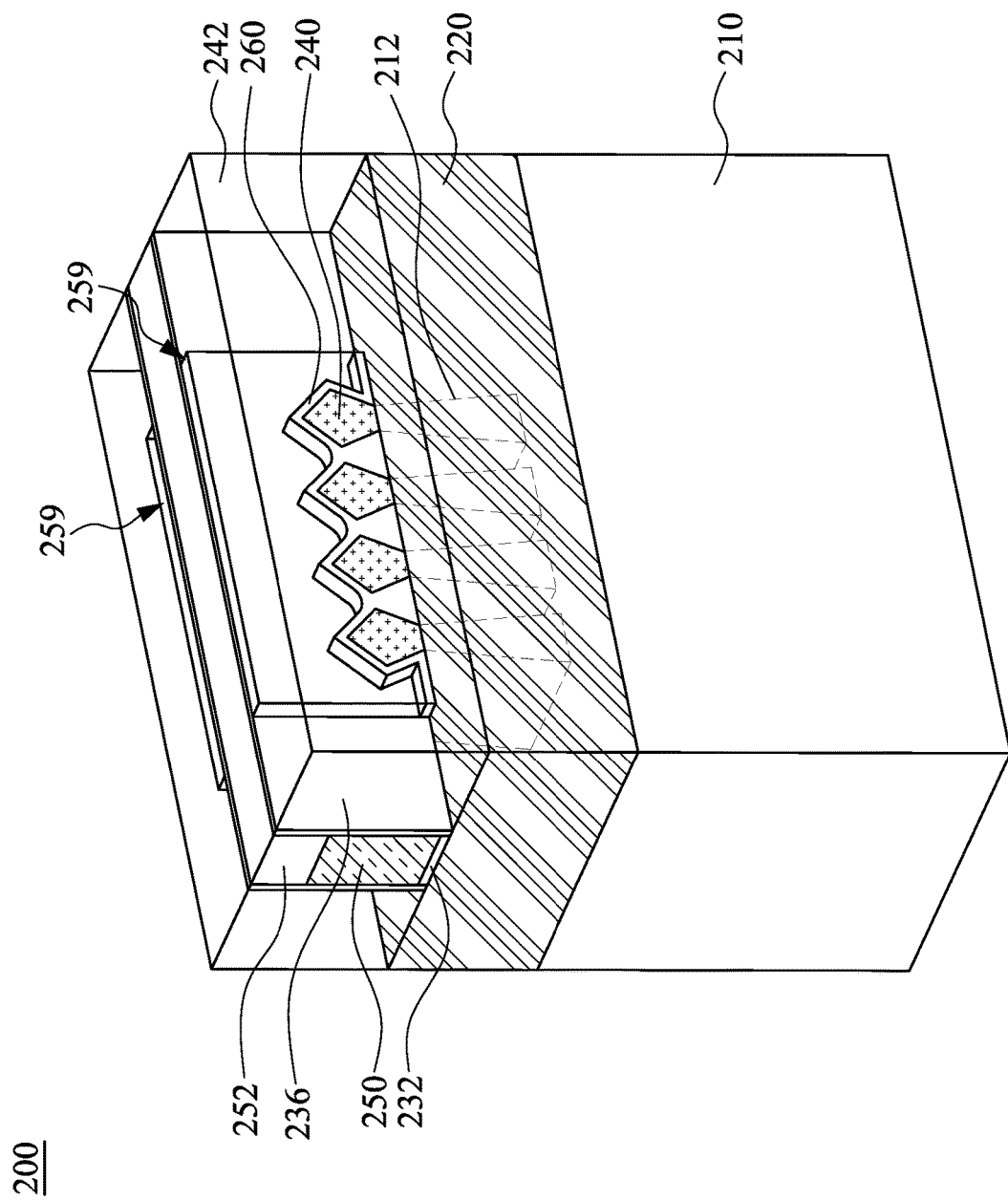
Figure 18:
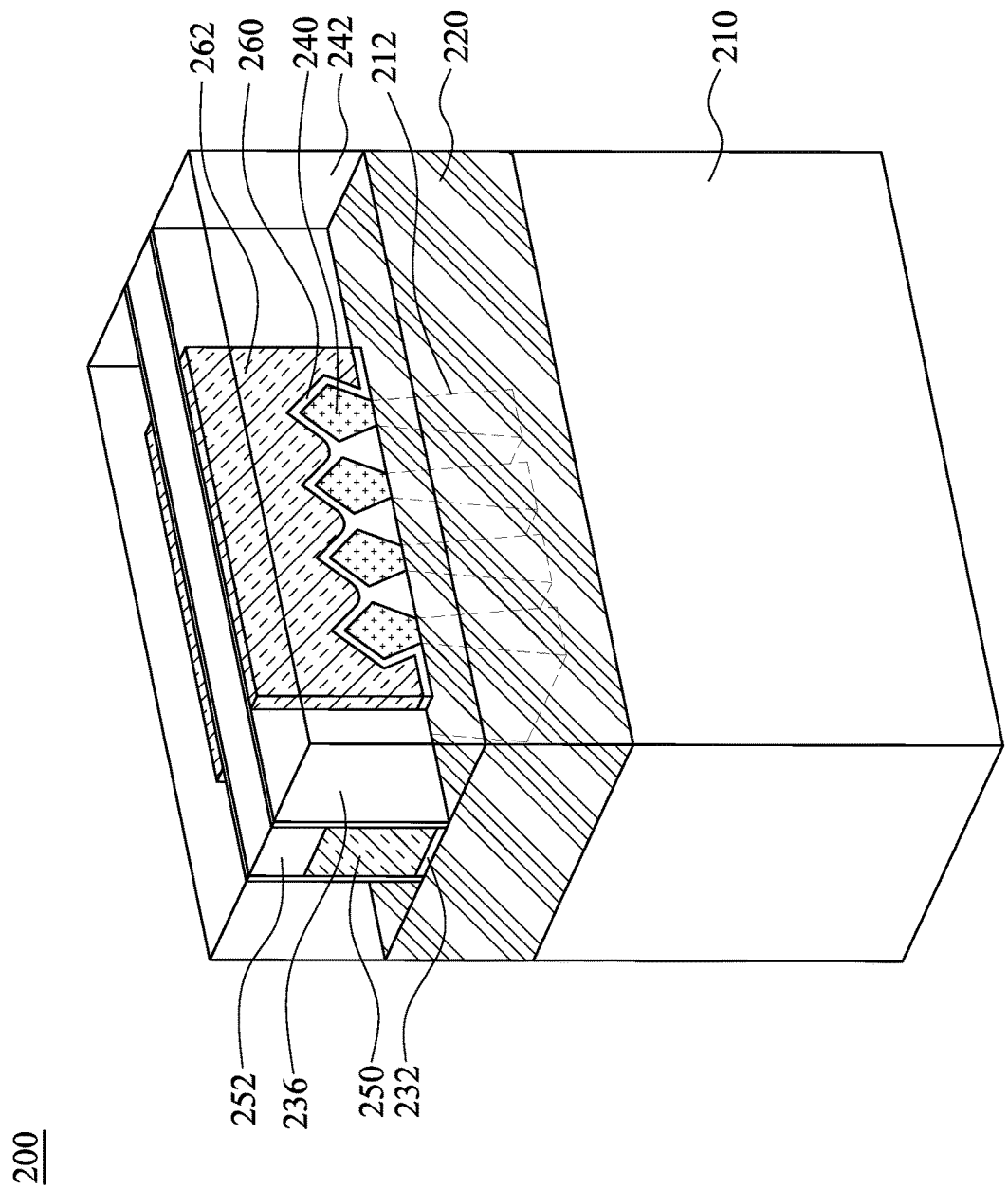
Figure 19:
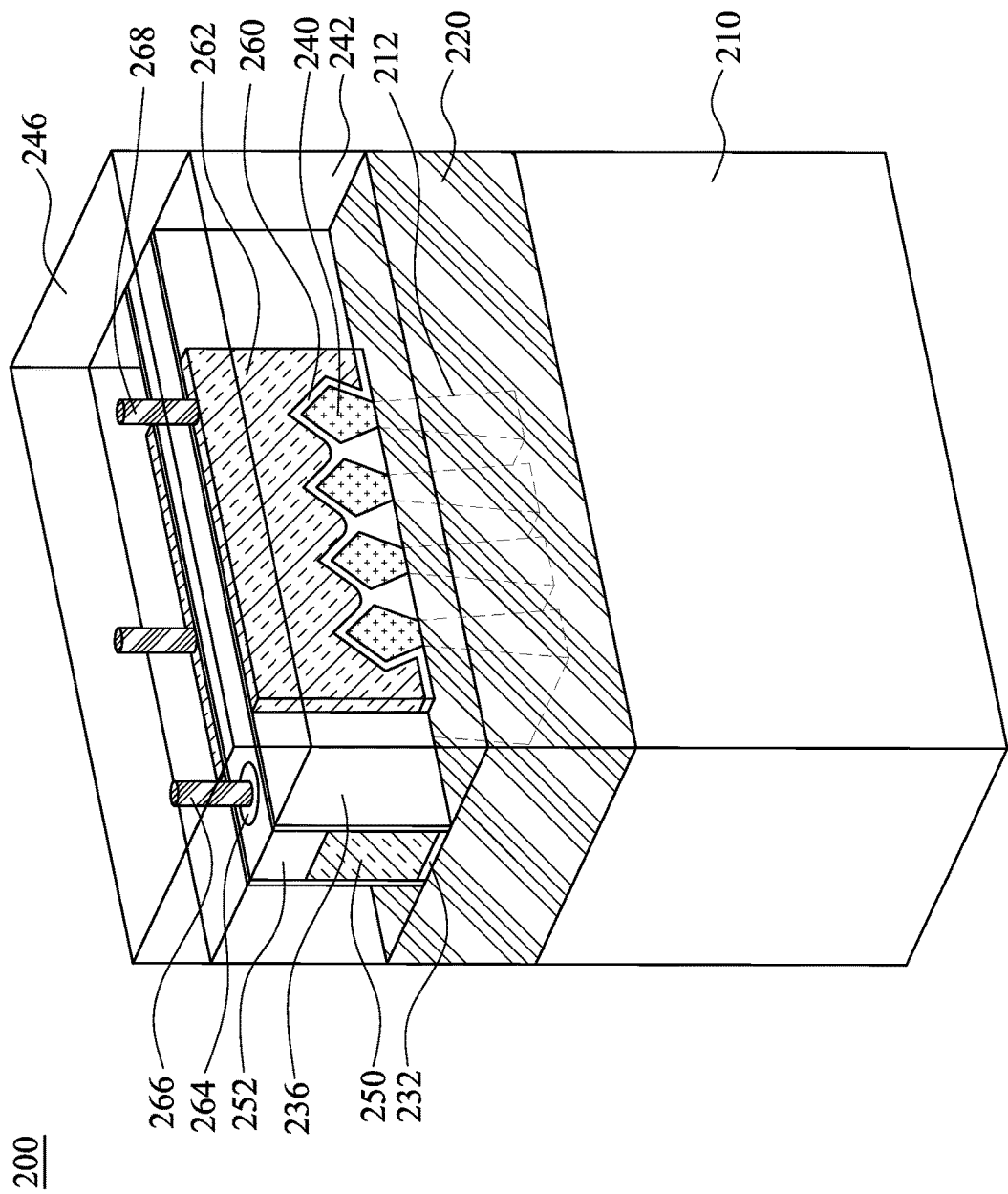

FIG. 10 is a flowchart of a method for manufacturing a semiconductor device 200 in accordance with some embodiments of the present disclosure. FIGS. 11-18 illustrate a method of forming a semiconductor device 200 in accordance with some embodiments of the present disclosure. The method begins with block S201 in which fins 212 are formed on a substrate 210 (as shown in FIG. 11). The method continues with block S202 in which an isolation dielectric 220 is formed in a trench T between fins 212 (as shown in FIGS. 12 and 13). The method continues with block S203 in which a dummy gate structure 230 is formed to wrap around the fins 212 (as shown in FIG. 14). The method continues with block S204 in which epitaxial source/drain (S/D) features 240 is formed on the fins 212 and an ILD layer 242 is formed over the epitaxial S/D features 240 (as shown in FIG. 15). The method continues with block S205 in which the dummy gate structure 236 is replaced with a replacement gate structure 250 (as shown in FIG. 16). The method continues with block S206 in which source/drain contact holes 259 are formed in the ILD layer 242 to expose the epitaxial source/drain features 240 (as shown in FIG. 17). The method continues with block S207 in which silicide layers 260 are formed over the epitaxial S/D features 240 and S/D contacts 262 are formed on the silicide layers 260 (as shown in FIGS. 17 and 18). The method continues with block S208 in which a gate contact 252 is formed on the replacement gate structure 250, a gate via 266 is formed on the gate contact 252, and S/D vias 268 are formed on the S/D contacts 262 (as shown in FIG. 19).

Reference is made to FIG. 11. A series of deposition and photolithography processes are performed to form a plurality of fins 212 on a substrate 210. The fins 212 are separated by trenches T. In some embodiments, the substrate 210 is a semiconductor substrate, such as a bulk semiconductor, a semiconductor-on-insulator (SOI) substrate, or the like. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Reference is made to FIG. 12. An isolation dielectric 220 is formed to overfill the trenches T and cover the fins 212 (see FIG. 11). In some embodiments, the isolation dielectric 220 is made of a thermally-conductive and electrically-non-conductive material. Example materials of the isolation dielectric 220 include diamond, aluminum nitride (AlN), diamond-like-carbon (DLC), beryllium oxide (BeO), aluminum oxide ($Al_2O_3$), magnesium oxide (MgO), and boron nitride (BN), or combinations thereof, and may be formed by CVD, PVD, and/or other suitable processes. In some embodiments, example materials of the isolation dielectric 220 include other insulating materials.

Thereafter, a planarization process such as CMP is performed to remove the excess isolation dielectric 220 over the fins 212. Next, the isolation dielectric 220 is recessed, for example, through an etch back process, wherein diluted HF, SiCoNi (including HF and $NH_3$), or the like, may be used as the etchant. The resulting structure is shown in FIG. 13. After recessing the isolation dielectric 220, some portions of the fins 212 are higher than a top surface of the isolation dielectric 220. The resulting isolation dielectric 220 in the trenches T can be referred to as a shallow trench isolation (STI) structure.

Reference is made to FIG. 14. A gate dielectric layer 232, a dummy gate electrode layer 234, and at least one pair of spacers 236 are formed over the fins 212. In some embodiment, a gate dielectric layer is blanket formed over the substrate 210 to cover the fins 212 and the isolation dielectric 220, and a dummy gate electrode layer is formed over the gate dielectric layer. After forming the gate dielectric layer and the dummy gate electrode layer, one or more etching processes are performed to form a dummy gate structures 230 wrapping around the fins 212 using an etching mask, and the etching mask can be removed after the etching. The dummy gate structure 230 includes a gate dielectric layer 232 and a dummy gate electrode layer 234 over the gate dielectric layer 232. The dummy gate structure 230 has a substantially parallel longitudinal axis that is substantially perpendicular to a longitudinal axis of at least one of the fins 212. The dummy gate structure 230 will be replaced with a replacement gate structure using a "gate-last" or replacement-gate process.

In some embodiments, the gate dielectric layer 232 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 232 is an oxide layer. The gate dielectric layer 232 may be formed by a deposition processes, such as chemical vapor deposition (CVD), physical vapor deposition (PVD), atomic layer deposition (ALD), plasma enhanced CVD (PECVD) or other suitable techniques.

In some embodiments, the dummy gate electrode layer 234 may include polycrystalline-silicon (poly-Si), polycrystalline silicon-germanium (poly-SiGe), metallic nitrides, metallic silicides, metallic oxides, or metals. In some embodiments, the dummy gate electrode layer 234 includes a metal-containing material such as TiN, TaN, TaC, Co, Ru, Al, combinations thereof, or multi-layers thereof. The dummy gate electrode layer 234 may be deposited by CVD, physical vapor deposition (PVD), sputter deposition, or other techniques suitable for depositing conductive materials.

After forming the dummy gate structure 230, gate spacers 236 are formed along sidewalls of the dummy gate structure 230. In some embodiments, the gate spacers 236 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 236 may include a single layer or multilayer structure made of different dielectric materials. The method of forming the gate spacers 236 includes blanket forming a dielectric layer by using, for example, CVD, PVD or ALD, and then performing an etching process such as anisotropic etching to remove horizontal portions of the dielectric layer. The remaining portions of the dielectric layer on the sidewalls of the dummy gate structure 230 can serve as the gate spacers 236. In some embodiments, the gate spacers 236 may be used to offset subsequently formed doped regions, such as source/drain regions. The gate spacers 236 may further be used for designing or modifying the source/drain region profile.

Thereafter, portions of the fins 212 not covered by the dummy gate structure 230 and the gate spacers 210 are etched. Epitaxial source/drain (S/D) features 240 are then formed on the etched fins 212. Afterwards, an ILD layer 242 is formed over the S/D features 240 and dummy gate structure 230. The resulting structure is shown in FIG. 15. In some embodiments, removing the portions of the fins 212 not covered by the dummy gate structure 230 and the gate spacers 210 is performed by suitable etching techniques. The remaining fins 212 have channel portions wrapped around by the dummy gate structure 230 and S/D portions embedded in the isolation dielectric 220. In some embodiments, etching the fins 212 may include a dry etching process, a wet etching process, or combination dry and wet etching processes. This etching process may include reactive ion etch (RIE) using the dummy gate structure 230 and gate spacers 236 as masks, or by any other suitable removal process. After the etching process, a pre-cleaning process may be performed to clean the remaining fins 212 with hydrofluoric acid (HF) or other suitable solution in some embodiments.

After the formation of etching the fins 212, the epitaxial S/D features 240 are epitaxially grown from the respective fins 212. The epitaxial S/D features 240 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions of the remaining fins 212. In some embodiments, lattice constants of the epitaxial S/D features 240 are different from that of the remaining fins 212, so that the channel region between the epitaxial S/D features 240 can be strained or stressed by the epitaxial S/D features 240 to improve carrier mobility of the semiconductor device and enhance the device performance.

In some embodiments, the epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 212 (e.g., silicon, silicon germanium, silicon phosphate, or the like). The epitaxial S/D features 240 may be in-situ doped. The doping species include p-type dopants, such as boron or $BF_2$; n-type dopants, such as phosphorus or arsenic; and/or other suitable dopants including combinations thereof. If the epitaxial S/D features 240 are not in-situ doped, an implantation process is performed to dope the epitaxial S/D features 240. One or more annealing processes may be performed to activate the epitaxial S/D features 240. The annealing processes include rapid thermal annealing (RTA) and/or laser annealing processes.

After the epitaxial S/D features 240 are formed, the ILD layer 242 is formed over the epitaxial S/D features 240. In some embodiments, the ILD layer 242 is made of a different material than the dielectric cover layer and is made of, for example, one or more layers of silicon oxide, SiCN, SiOCN or a low-k material. Formation of the ILD layer 242 includes depositing the ILD layer 242 over the dummy gate structure 230, followed by planarizing the ILD layer 242 until the dummy gate structure 230 is exposed.

Thereafter, the dummy gate electrode layer 234 is removed to form a gate trench with the gate spacers 236 as its sidewalls, and a gate structure 250 is formed in the gate trench, and then a selective etch process is performed to etch back the gate structure 250. Afterwards, a dielectric cap 252 is formed over the etched back gate structure 250. The resulting structure is illustrated in FIG. 16. In some embodiments, the dummy gate electrode layer 234 is removed by an appropriate etching process, and the gate dielectric layer 232 remains between the gate spacers 236. In some other embodiments, the gate dielectric layer 232 is removed and replaced with a high-k dielectric layer.

An exemplary method of forming the gate structure 250 may include blanket forming one or more work function metal layers over the gate dielectric layer 232, forming a fill metal layer over the one or more work function metal layers, and performing a CMP process to remove excessive materials of the fill metal layer and the one or more work function metal layers outside the gate trench. As a result of this method, the gate structure 250 may include one or more work function metal layers and a fill metal wrapped around by the one or more work function metal layers.

In some embodiments, example materials of the one or more work function metal layers may include one or more n-type work function metals (N-metal) for forming an n-type transistor on the substrate 210. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, example materials of the one or more work function metal layers may include one or more p-type work function metals (P-metal) for forming a p-type transistor on the substrate 210. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, example materials of the fill metal may include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Reference is made to FIG. 17. Source/drain contact holes 259 are etched in the ILD layer 242 to expose the epitaxial S/D features 240, and then a metal alloy layer 260 is formed in the contact holes 259 and over the epitaxial S/D features 240. The metal alloy layer 260 is an alloy made of one or more Group IV element and one or more transition metal elements. When the epitaxial S/D features 240 are formed by silicon, the metal alloy layer 260 is a silicide layer. When the epitaxial S/D features 240 are formed by germanium, the metal alloy layer 260 is a germanide layer. When the epitaxial S/D features 240 are formed by SiGe, the metal alloy layer 260 is a silicide-germanide layer. The transition metal includes one or more of Ti, Ta, Ni and Co. The metal alloy layer 260 is one or more of TiSi, TaSi, NiSi, CoSi, TiSiGe, TaSiGe, NiSiGe and CoSiGe.

After the contact holes 259 are etched in the ILD layer 242, transition metal is deposited by, for example, CVD, ALD or PVD, on the epitaxial S/D features 240. During the deposition, the deposited transition metal reacts with Si and/or Ge in the epitaxial S/D features 240, thereby forming the alloy layer 260 in some embodiments. In some embodiments, silicide (alloy) layer can be formed by PECVD, CVD, PEALD, or ALD metal, and then an in-situ dry etching using Cl or F based gas or ex-situ wet selective etching is applied to remove the remaining metal on spacer and the isolation insulating layer. In other embodiments, the silicide (alloy) layer can be formed by PECVD, CVD, PEALD, or ALD. In certain embodiments, a nitridation treatment is later performed to passivate silicide surface for the subsequent silicide formation anneal. In other embodiments, a selective silicide deposition process through surface blocking by self-assembly molecular (SAMs), or inherent selective formation from proper metal and silicon precursors is performed. Other suitable silicide formation processes may be utilized. In some embodiments, after a transition metal layer is formed on the epitaxial S/D features 240, an annealing operation is performed to form the metal alloy layer 260.

Reference is made to FIG. 18. S/D contacts 262 are formed over the metal alloy layer 260. In some embodiments, after the metal alloy layer 260 is formed, a contact-etch stop layer (CESL) is formed to cover the metal alloy layer 260. The CESL is made of a silicon nitride based material, such as SiN, SiON or the like. In some embodiments, example materials of the S/D contacts 262 include, but are not limited to, Ti, TiN, TaN, Co, Ru, Pt, W, Al, Cu, or combinations thereof.

Afterwards, a gate contact 264 is formed in the dielectric cap 252 and over the gate structure 250 using suitable lithography, etching and deposition techniques. Thereafter, another ILD layer 246 is formed over the S/D contacts 262 and the gate contact 264, and a gate via 266 and S/D vias 268 are formed in the ILD layer 246 and respectively over the gate contact 264 and the S/D contacts 262. The resulting structure is illustrated in FIG. 19. Example materials of the gate contact 264, the gate via 266 and the S/D vias 268 include, but are not limited to, Ti, TiN, TaN, Co, Ru, Pt, W, Al, Cu. Example materials of the ILD layer 246 include, but are not limited to, silicon oxide, SiCN, SiOCN or a low-k material.

A semiconductor device as illustrated in FIG. 19 including the fins 212 can be referred to as a multi-channel semiconductor device. A region between the fins 212 of the multi-channel semiconductor device can be referred to as an inter-channel region of the multi-channel semiconductor device. As illustrated in FIG. 19, the inter-channel region is filled with the isolation dielectric 220. Since the isolation dielectric 220 within the inter-channel region of the multi-channel semiconductor device has a thermal conductivity greater than silicon oxide, a junction temperature (Tj) of each of the fins 212 of the multi-channel semiconductor device may decrease. In some embodiments where the ILD layer 242 and/or ILD layer 246 are made of silicon oxide, the thermal conductivity of the isolation dielectric 220 is greater than a thermal conductivity of the ILD layer 242 and/or a thermal conductivity of the ILD layer 246. Furthermore, a region outside the semiconductor device 200 can be referred to as an inter-device region. That is, the inter-device region is between the four fins 212 and other fins of other multi-channel semiconductor devices. In some embodiments, in the resulting structure depicted in FIG. 19, the fins 212 may be designed to have a fin height in a range from 35 nm to 55 nm, a fin width in a range from 5 nm to 15 nm, and a fin pitch in a range from 25 nm to 60 nm, and a gate length formed by the fins 212 and the gate structure 250 is in a range from 14 nm to 30 nm. Furthermore, in some embodiments, more than one gate via is formed in the dielectric cap 252, and these gate vias are arranged by a contacted poly pitch (CPP) in a range from 40 nm to 90 nm. If the dimension (e.g., fin height, the fin width, the fin pitch, the gate length, or the CPP) above is out of the selected range, the complexity of the process might increase and the performance of the semiconductor device might be affected as well.

Figure 20:
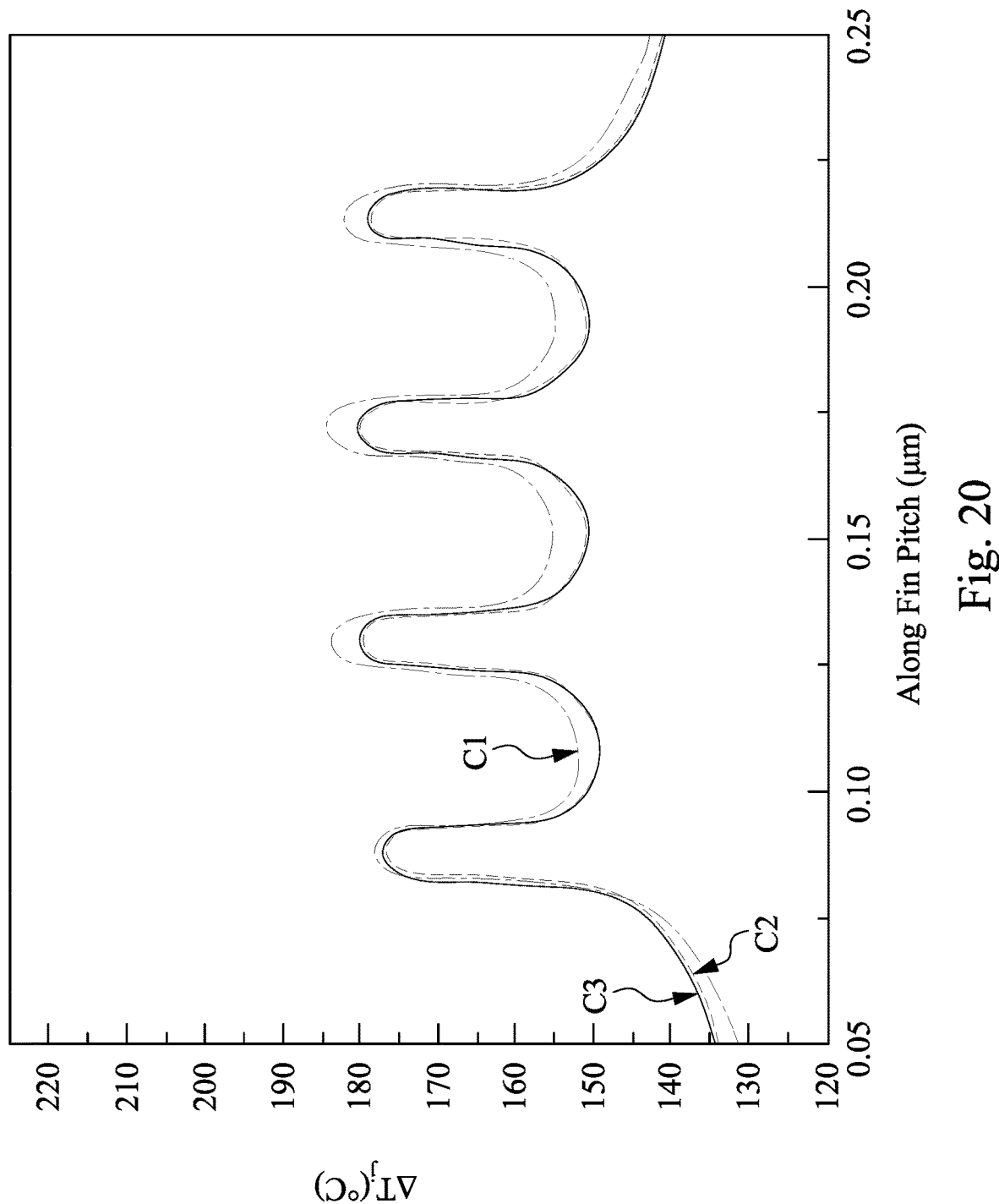
FIG. 20 is a graph plotting junction temperature versus line along fin pitch according to some embodiments of the present disclosure.

FIG. 20 is a graph plotting junction temperature versus line along fin pitch according to some embodiments of the present disclosure, in which the horizontal axis represents an along-fin pitch (in μm), and the vertical axis represent a junction temperature (in ° C.). In the graph illustrated in FIG. 20, temperature distribution of a semiconductor device including an isolation dielectric made of silicon oxide is labeled as a curve C1, temperature distribution of a semiconductor device including an isolation dielectric made of BeO is labeled as a curve C2, and temperature distribution of a semiconductor device including an isolation dielectric made of diamond is labeled as a curve C3. As illustrated in FIG. 20, the temperature variation (as shown by curve C2) of a semiconductor device having the BeO STI is lower than the temperature variation (as shown by curve C1) of a semiconductor device having the silicon oxide STI, and the temperature variation (as shown by curve C3) of a semiconductor device having the diamond STI is lower than the temperature variation (as shown by curve C1) of a semiconductor device having the silicon oxide STI as well. Therefore, forming the STI using diamond and/or BeO will improve temperature uniformity in the multi-channel semiconductor device.

FIGS. 21-26 illustrate a method of forming a semiconductor device 300 in accordance with some embodiments of the present disclosure. Many aspects of the method of forming the semiconductor device 300 are the same as or similar to those of the method of forming the semiconductor device 200 as depicted in FIGS. 11-19, and thus the detailed explanation may be omitted.

Figure 21:
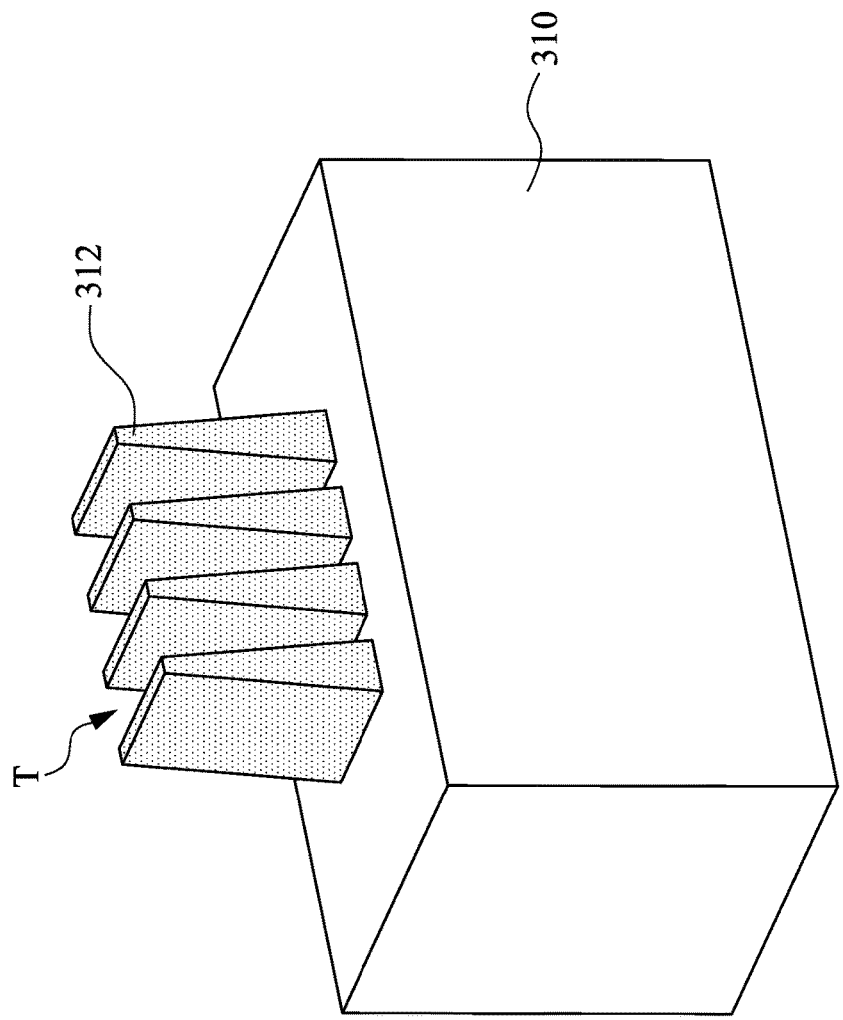
FIGS. 21-26 illustrate a method of forming a semiconductor device in accordance with some embodiments of the present disclosure.
Figure 22:
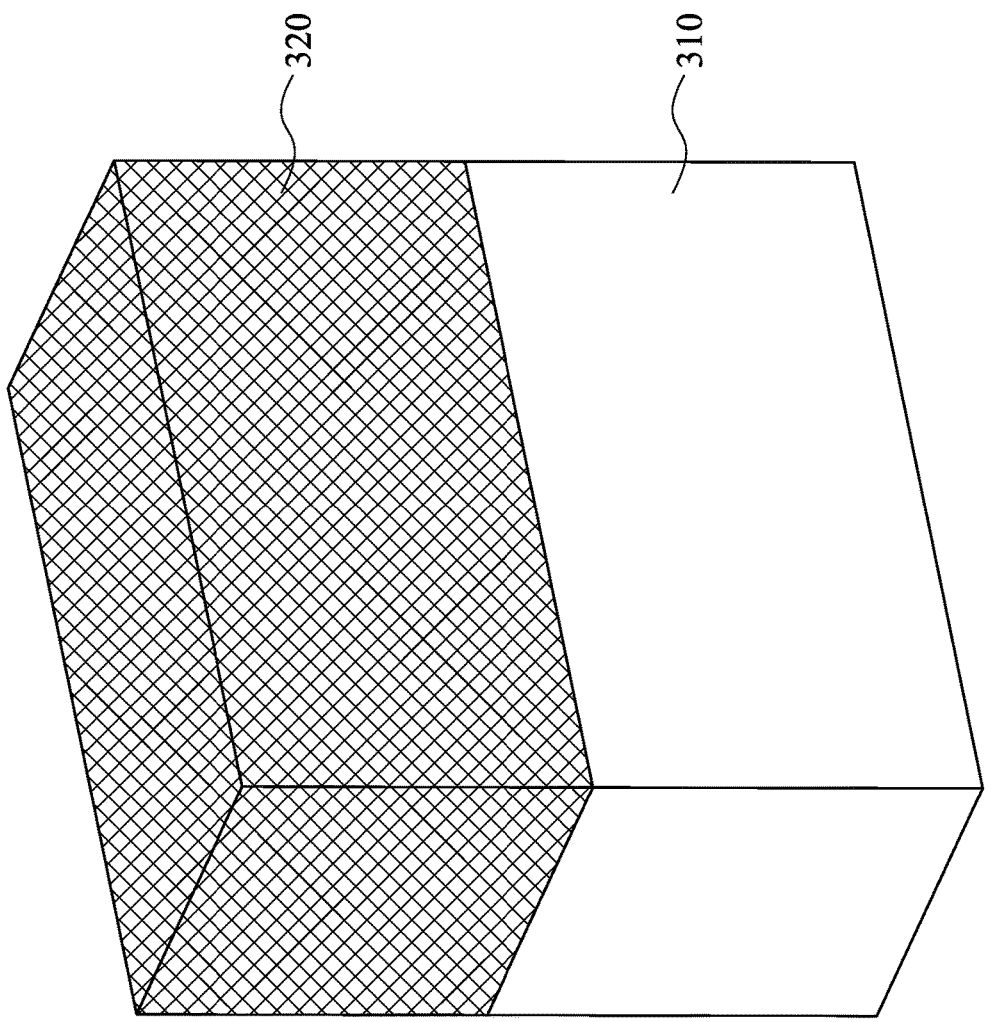

Reference is made to FIGS. 21 and 22. A plurality of fins 312 are formed on the substrate 310, using suitable method as discussed previously with respect to the fins 212 and substrate 210 depicted in FIG. 11. Then, a first isolation dielectric 320 is formed to overfill the trenches T between the fins 312. In some embodiments, the isolation dielectric 320 is made of a thermally-conductive material. Example materials of the first isolation dielectric 320 include diamond, aluminum nitride (AlN), diamond-like-carbon (DLC), beryllium oxide (BeO), aluminum oxide ($Al_2O_3$), magnesium oxide (MgO), and boron nitride (BN), or combinations thereof, and may be formed by CVD, PVD, and/or other suitable processes.

Figure 23:
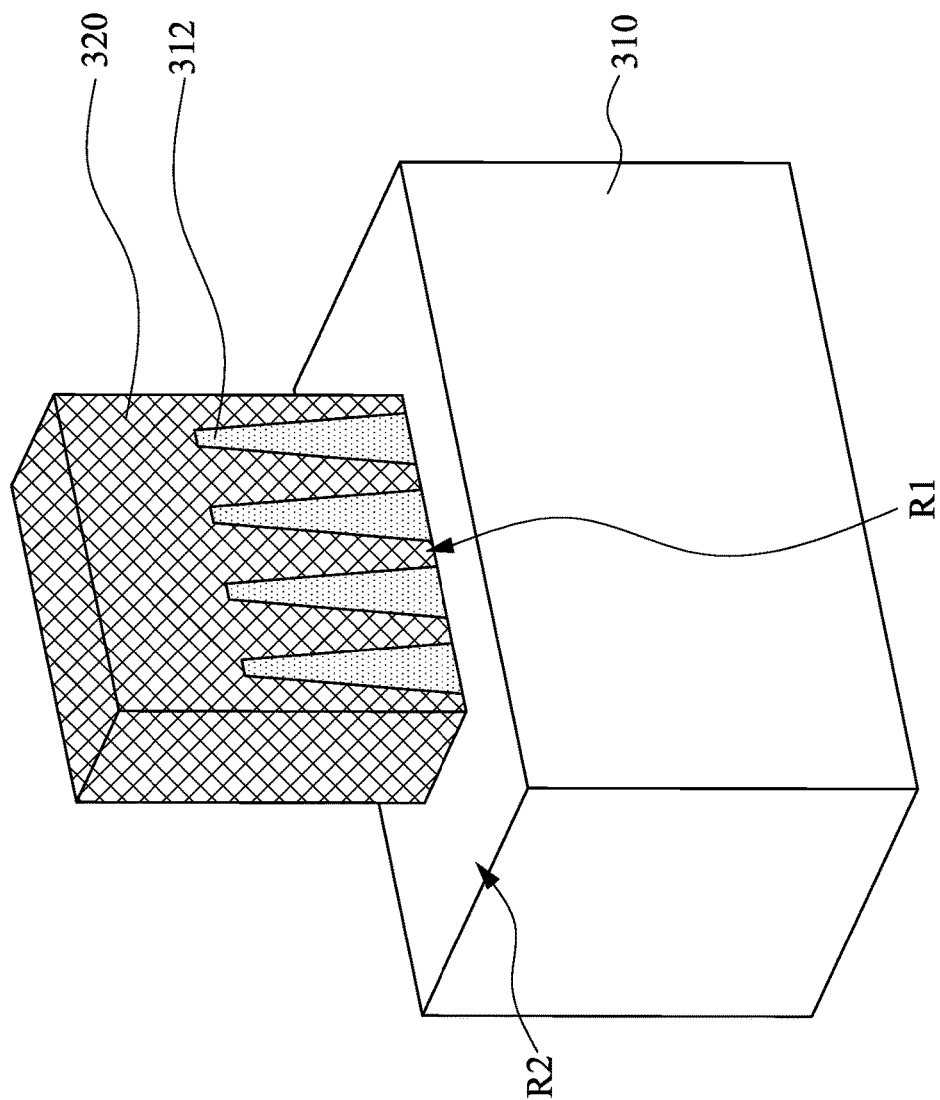

Reference is made to FIG. 23. A portion of the first isolation dielectric 320 is removed using suitable lithography and etching techniques, and another portion of the first isolation dielectric 320 remains covering the fins 312. The first isolation dielectric 320 remains in an inter-channel region (or intra-device region) R1 between the fins 312, and an inter-device region R2 outside the inter-channel region R2 is free from coverage by the first isolation dielectric 320.

Figure 24:
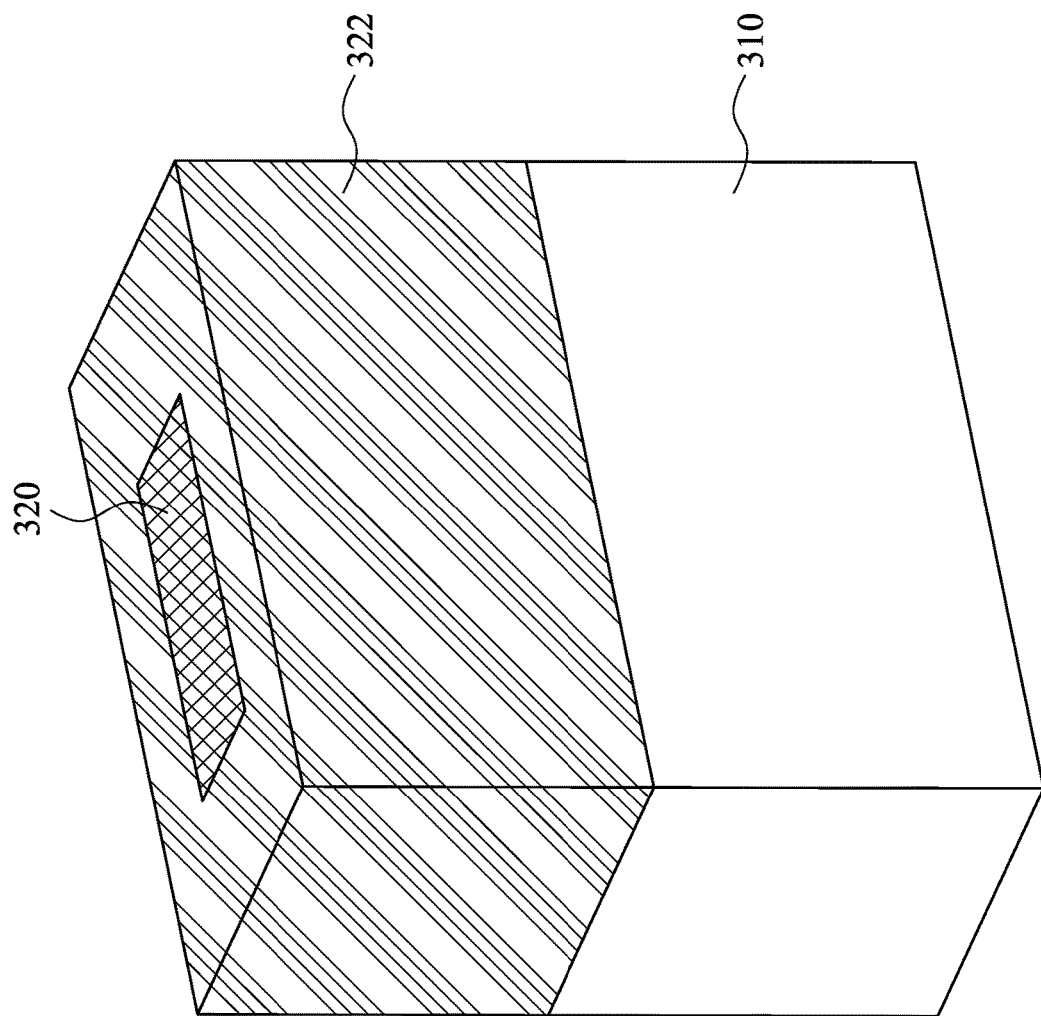

Reference is made to FIG. 24. A second isolation dielectric 322 is formed on the substrate 310 and around the first isolation dielectric 320. Stated differently, the second isolation dielectric 322 is formed on the inter-device region R2 outside the inter-channel region R1. In some embodiments, the second isolation dielectric 322 is made of a different material than the first isolation dielectric 320. In some embodiments, example materials of the second isolation dielectric 322 includes silicon oxide, low-k dielectric materials, the like or combinations thereof. In some embodiments, formation of the second isolation dielectric 322 includes depositing the second isolation dielectric 322 on the substrate 310 and performing a planarization process until the first isolation dielectric 322 is exposed.

Figure 25:
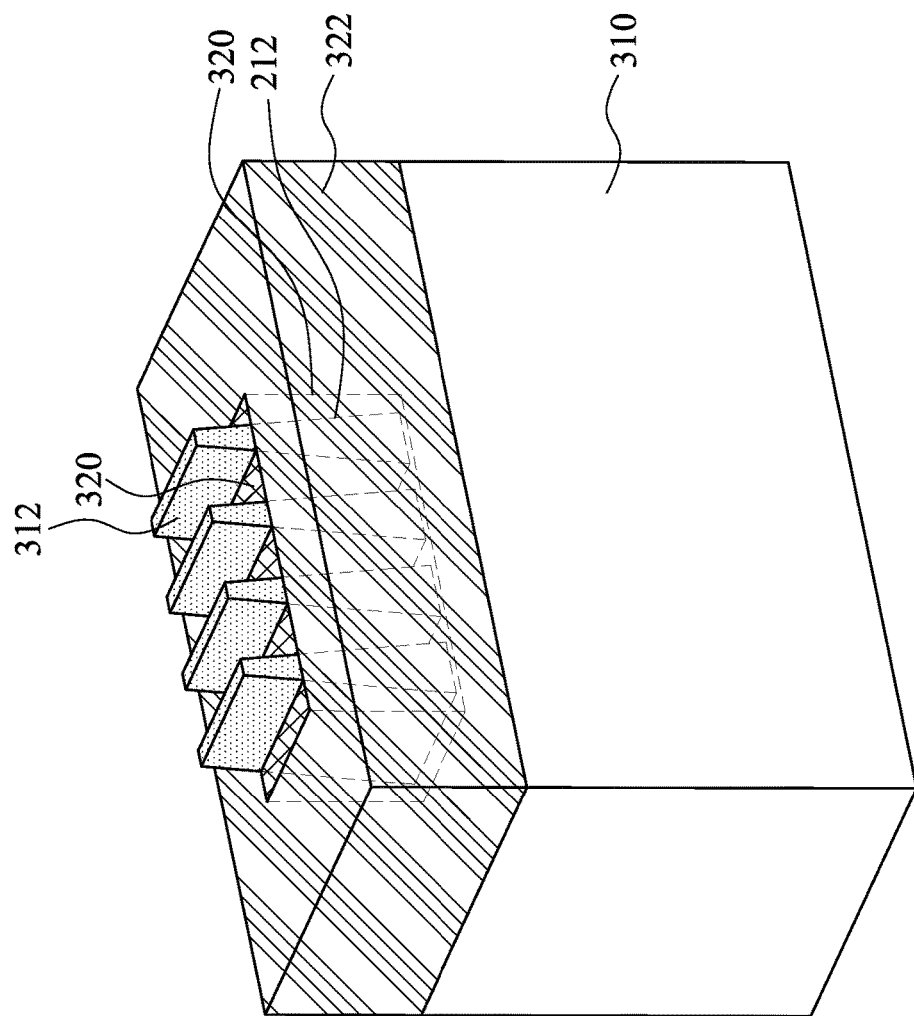

Reference is made to FIG. 25, the first and second isolation dielectrics 320, 322 are etched back to expose the fins 312 using a non-selective etching process as example, such that the fins 312 protrude from the first and second isolation dielectrics 320 and 322. The resulting first isolation dielectric 320 can be referred to as an inter-channel STI or intra-device STI, and the resulting second isolation dielectric 322 can be referred to as an inter-device STI.

Figure 26:
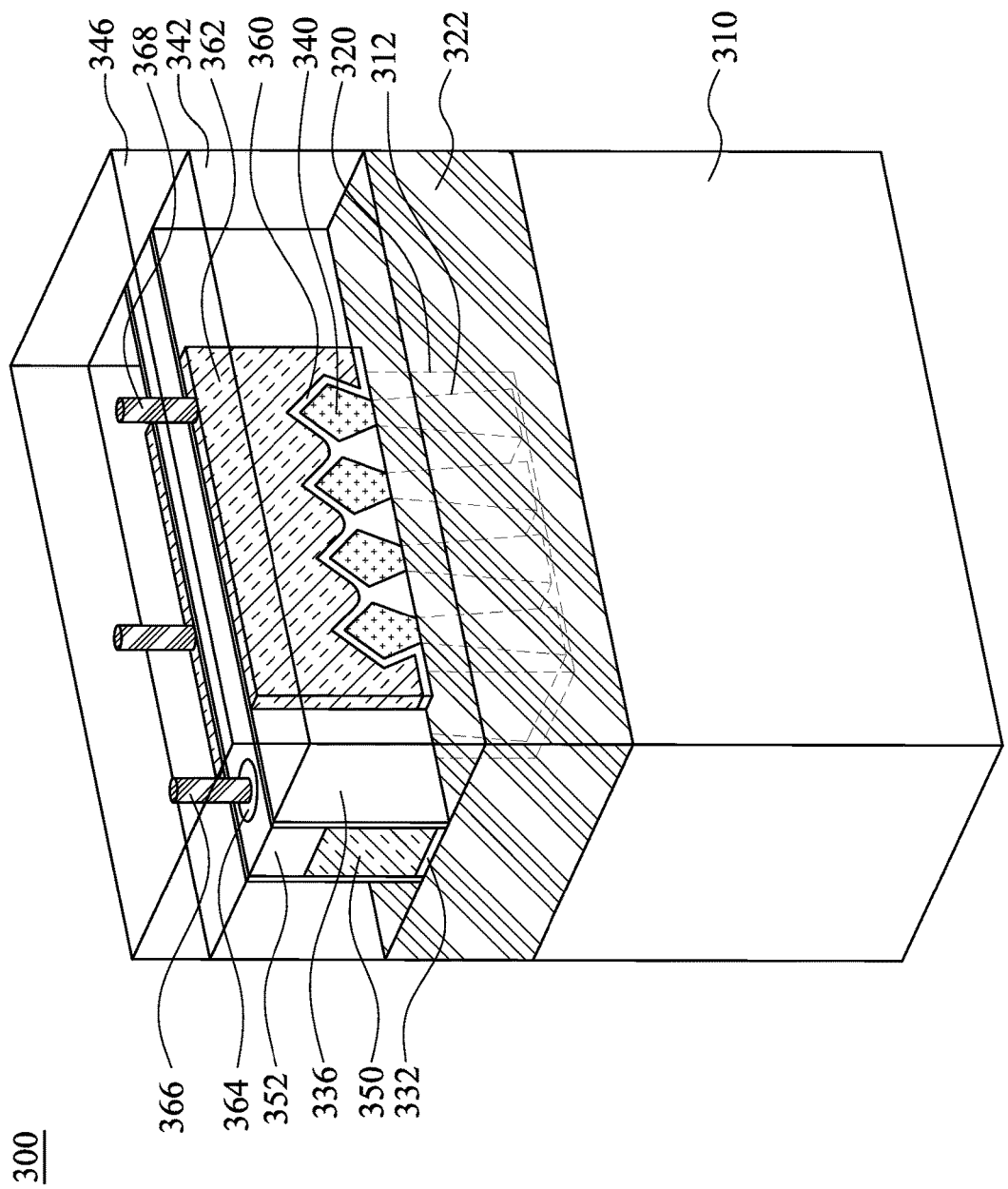

Afterwards, a gate dielectric layer 332, gate spacers 336, a gate structure 350, a dielectric cap 352, epitaxial S/D features 340, ILD layers 342 and 346, a silicide layer 360, S/D contacts 362, at least one gate contact 364, at least one gate via 366, and S/D vias 368 are formed on the substrate 310 using suitable processes as discussed previously with respect to FIGS. 14-19. The resulting structure is depicted in FIG. 26. In some embodiments, the gate structure 350 is formed across a boundary between the first and isolation dielectrics 320 and 322. As shown in FIG. 26, since the first isolation dielectric 320 is within the inter-channel region where the fins 312 are located, reduced temperature difference among the fins 312 is achieved.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that thermal via is formed on a non-insulator structure (e.g., gate electrode, epitaxial S/D feature, or metal line) of semiconductor device using the thermally-conductive materials, such as diamond, AlN, and/or BeO, and thus can reduce the thermal resistance and/or junction temperature. Another advantage is that concern about CTE mismatch between ILD and vias can be eased because the thermal vias have lower CTE than electrical vias (e.g., Cu vias), and thus the via density can be increased. Yet another advantage is that the STI is formed using thermally-conductive material having a thermal conductivity higher than one hundred times the thermal conductivity of silicon oxide, which in turn improves temperature uniformity in a front-end-of-line (FEOL) structure having multiple semiconductor fins.

According to various embodiments of the present disclosure, a device includes plural semiconductor fins, a gate structure, an interlayer dielectric (ILD) layer, and an isolation dielectric. The gate structure is across the semiconductor fins. The ILD surrounds the gate structure. The isolation dielectric is at least between the semiconductor fins and has a thermal conductivity greater than a thermal conductivity of the ILD layer.

According to various embodiments of the present disclosure, a device includes semiconductor fins, a first isolation dielectric, a second isolation dielectric, and a gate structure. The first isolation dielectric is at least between the semiconductor fins. The second isolation dielectric surrounds the first isolation dielectric. The first and second isolation dielectrics comprise different materials. A thermal conductivity of the second isolation dielectric is less than a thermal conductivity of the first isolation dielectric. The gate structure is over the semiconductor fins and over the first isolation dielectric and the second isolation dielectric.

According to various embodiments of the present disclosure, a device includes plural semiconductor fins, a gate structure, an interlayer dielectric (ILD) layer, and an isolation dielectric. The gate structure is over the semiconductor fins. The ILD layer surrounds the gate structure. The isolation dielectric is between the semiconductor fins. A coefficient of thermal expansion (CTE) of the isolation dielectric is greater than a CTE of the ILD layer.

The foregoing outlines features of several embodiments so that those skilled in the art may better understand the aspects of the present disclosure. those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a plurality of semiconductor fins;
   a gate structure across the semiconductor fins;
   a first interlayer dielectric (ILD) layer surrounding the gate structure; and
   a first isolation dielectric at least between the semiconductor fins and having a thermal conductivity greater than a thermal conductivity of the first ILD layer.

2. The device of claim 1, wherein the first isolation dielectric has coefficient of thermal expansion (CTE) greater than CTE of the first ILD layer.

3. The device of claim 1, further comprising:
   a second isolation dielectric surrounding the first isolation dielectric, wherein the first and second isolation dielectrics are made of different materials.

4. The device of claim 3, wherein the second isolation dielectric has a thermal conductivity less than the thermal conductivity of the first isolation dielectric.

5. The device of claim 3 further comprising:
   a gate contact over the gate structure, wherein the gate contact is directly above the second isolation dielectric.

6. The device of claim 3, wherein top ends of the semiconductor fins are higher than a top surface of the second isolation dielectric.

7. The device of claim 1, further comprising:
   a plurality of source/drain features respectively over the semiconductor fins; and
   a source/drain contact over the source/drain features, wherein the source/drain contact is directly above the first isolation dielectric.

8. The device of claim 1, further comprising:
   a second ILD layer over the gate structure and the first ILD layer, wherein the thermal conductivity of the first isolation dielectric is greater than a thermal conductivity of the second ILD layer; and
   a gate via in the second ILD layer and electrically connected with the gate structure.

9. A device, comprising:
   a plurality of semiconductor fins;
   a first isolation dielectric at least between the semiconductor fins;
   a second isolation dielectric surrounding the first isolation dielectric, wherein the first and second isolation dielectrics comprise different materials, and a thermal conductivity of the second isolation dielectric is less than a thermal conductivity of the first isolation dielectric; and
   a gate structure over the semiconductor fins and over the first isolation dielectric and the second isolation dielectric.

10. The device of claim 9, further comprising:
    a gate contact over the gate structure, wherein the gate contact is directly above the second isolation dielectric.

11. The device of claim 9, further comprising:
    a plurality of source/drain features respectively over the semiconductor fins; and
    a source/drain contact over the source/drain features, wherein the source/drain contact is directly above the first isolation dielectric.

12. The device of claim 9, wherein at least one of the semiconductor fins has a first sidewall and a second sidewall shorter than the first sidewall, and the second sidewall of said at least one of the semiconductor fins adjoins the second isolation dielectric.

13. The device of claim 9, wherein at least one of the semiconductor fins has a first sidewall and a second sidewall shorter than the first sidewall, and the first sidewall of said at least one of the semiconductor fins adjoins the first isolation dielectric.

14. The device of claim 13, wherein the first isolation dielectric is free of extending beyond the second sidewall of said at least one of the semiconductor fins.

15. The device of claim 9, wherein the first isolation dielectric has a first portion between first and second ones of the semiconductor fins and a second portion between the second isolation dielectric and the first one of the semiconductor fins.

16. The device of claim 15, wherein the first portion and the second portion of the first isolation dielectric are separated from each other by the first one of the semiconductor fins.

17. A device, comprising:
    a plurality of semiconductor fins;
    a gate structure over the semiconductor fins;
    an interlayer dielectric (ILD) layer surrounding the gate structure; and
    a first isolation dielectric between the semiconductor fins, wherein a coefficient of thermal expansion (CTE) of the first isolation dielectric is greater than a CTE of the ILD layer.

18. The device of claim 17, wherein the first isolation dielectric comprises a metal-containing compound material.

19. The device of claim 17, further comprising:
    a second isolation dielectric surrounding the first isolation dielectric, wherein the first and second isolation dielectrics are made of different materials.

20. The device of claim 17, wherein at least one of the semiconductor fins has a first sidewall and a second sidewall shorter than the first sidewall, at least a portion of the first sidewall of said at least one of the semiconductor fins is covered by the first isolation dielectric, and an entirety of the second sidewall of said at least one of the semiconductor fins is free from coverage by the first isolation dielectric.

* * * * *